(12) United States Patent
Nguyen et al.

(10) Patent No.: US 10,867,757 B2
(45) Date of Patent: *Dec. 15, 2020

(54) RF-POWERED MICROMECHANICAL CLOCK GENERATOR

(71) Applicant: THE REGENTS OF THE UNIVERSITY OF CALIFORNIA, Oakland, CA (US)

(72) Inventors: Clark T.-C. Nguyen, Oakland, CA (US); Ruonan Liu, Berkeley, CA (US); Jalal Naghsh Nilchi, Berkeley, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 56 days.

This patent is subject to a terminal disclaimer.

(21) Appl. No.: 16/167,799

(22) Filed: Oct. 23, 2018

(65) Prior Publication Data

US 2019/0157015 A1 May 23, 2019

Related U.S. Application Data

(63) Continuation of application No. PCT/US2017/029769, filed on Apr. 27, 2017.
(Continued)

(51) Int. Cl.
*H03H 9/24* (2006.01)
*H03H 9/50* (2006.01)
(Continued)

(52) U.S. Cl.
CPC ........ *H01H 1/0036* (2013.01); *H03H 9/2426* (2013.01); *H03H 9/462* (2013.01);
(Continued)

(58) Field of Classification Search
CPC ......... H01H 1/0036; H01H 2001/0078; H03H 9/2405; H03H 9/2426; H03H 9/462;
(Continued)

(56) References Cited

U.S. PATENT DOCUMENTS

| 6,621,134 B1* | 9/2003 | Zurn | B81C 1/00246 |
| | | | 257/415 |
| 7,898,364 B2* | 3/2011 | Chen | H03H 9/2447 |
| | | | 333/133 |

(Continued)

FOREIGN PATENT DOCUMENTS

| WO | 2005117051 A1 | 12/2005 |
| WO | 2014047383 A1 | 3/2014 |

(Continued)

OTHER PUBLICATIONS

Korean Intellelctual Property Office (KIPO), International Search Report and Written Opinion dated Jul. 11, 2017, related PCT international application No. PCT/US2017/029769, pp. 1-10, with claims searched, pp. 11-17.

*Primary Examiner* — Levi Gannon
(74) *Attorney, Agent, or Firm* — O'Banion & Ritchey LLP; John P. O'Banion

(57) ABSTRACT

A microelectromechanical resonant switch ("resoswitch") converts received radio frequency (RF) energy into a clock output. The resoswitch first accepts incoming amplitude- or frequency-shift keyed clock-modulated RF energy at a carrier frequency, filters it, provides power gain via resonant impact switching, and finally envelop detects impact impulses to demodulate and recover the carrier clock waveform. The resulting output derives from the clock signal that originally modulated the RF carrier, resulting in a local clock that shares its originator's accuracy. A bare push-pull 1-kHz RF-powered mechanical clock generator driving an on-chip inverter gate capacitance of 5 fF can potentially operate with (Continued)

only 5 pW of battery power, 200,000 times lower than a typical real-time clock. Using an off-chip inverter with 17.5 pF of effective capacitance, a 1-kHz push-pull resonator would consume 17.5 nW.

49 Claims, 19 Drawing Sheets

Related U.S. Application Data

(60) Provisional application No. 62/333,182, filed on May 7, 2016, provisional application No. 62/328,114, filed on Apr. 27, 2016.

(51) Int. Cl.
  *H01H 1/00* (2006.01)
  *H04L 27/152* (2006.01)
  *H03K 3/01* (2006.01)
  *H03H 9/46* (2006.01)
  *H03K 5/135* (2006.01)

(52) U.S. Cl.
  CPC ............... *H03H 9/505* (2013.01); *H03K 3/01* (2013.01); *H03K 5/135* (2013.01); *H04L 27/152* (2013.01); *H01H 2001/0078* (2013.01)

(58) Field of Classification Search
  CPC ........ H03H 9/485; H03H 9/505; H03H 9/525; H04L 27/152
  See application file for complete search history.

(56) References Cited

U.S. PATENT DOCUMENTS

| | | | |
|---|---|---|---|
| 2001/0030489 A1* | 10/2001 | Nguyen | ............... H03H 3/0078 310/309 |
| 2004/0183617 A1* | 9/2004 | Harris | ................... B81B 3/0072 333/24.2 |
| 2004/0264878 A1* | 12/2004 | Choi | ..................... H01H 1/0036 385/78 |
| 2006/0132891 A1 | 6/2006 | Kim | |
| 2011/0067984 A1* | 3/2011 | Nguyen | ................. H01P 1/127 200/181 |

FOREIGN PATENT DOCUMENTS

| | | |
|---|---|---|
| WO | 2015030898 A2 | 3/2015 |
| WO | 2015179407 A1 | 11/2015 |

* cited by examiner

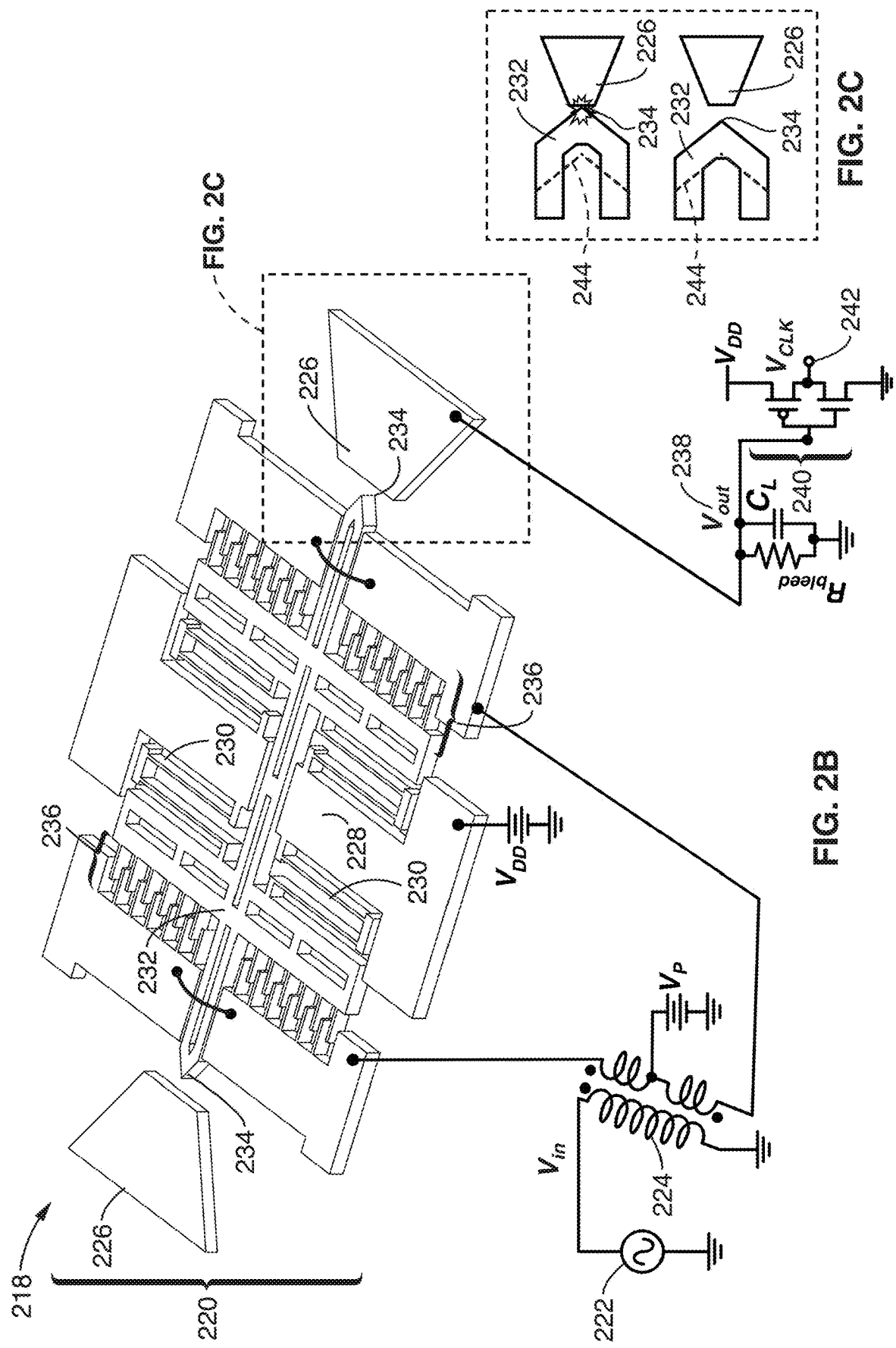

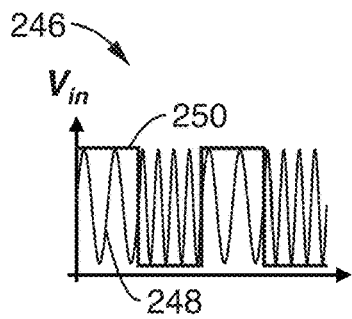
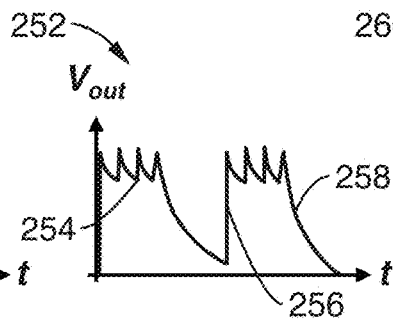
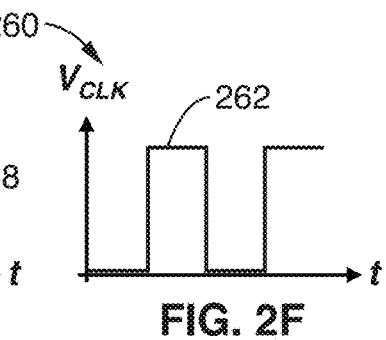
FIG. 2D
FIG. 2E
FIG. 2F
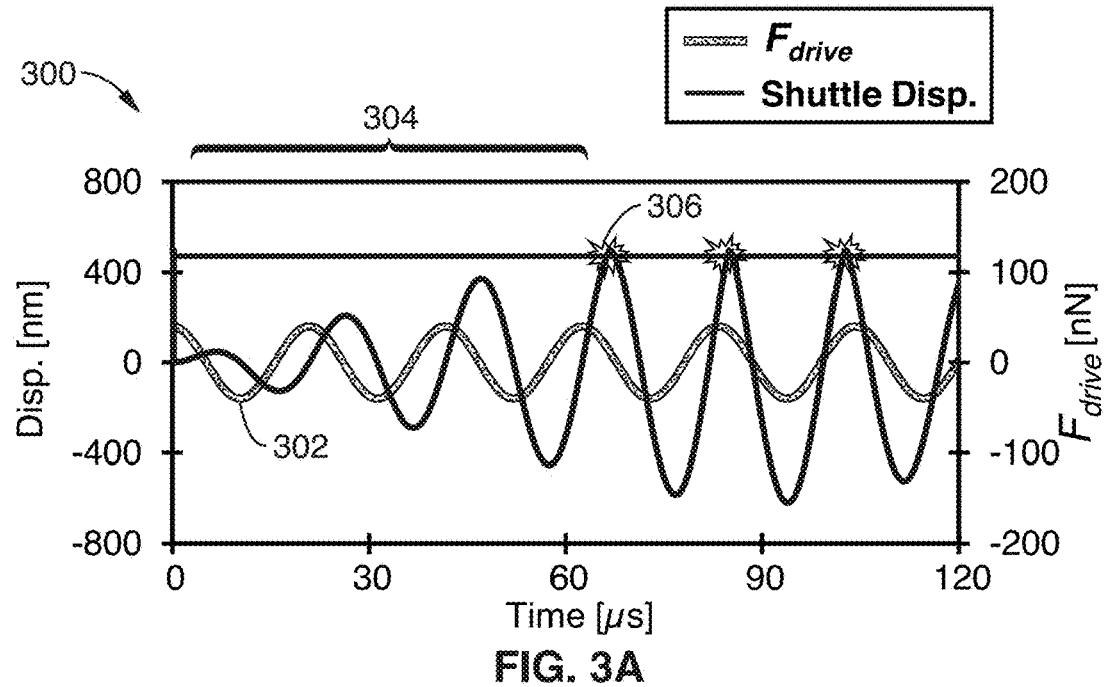
FIG. 3A
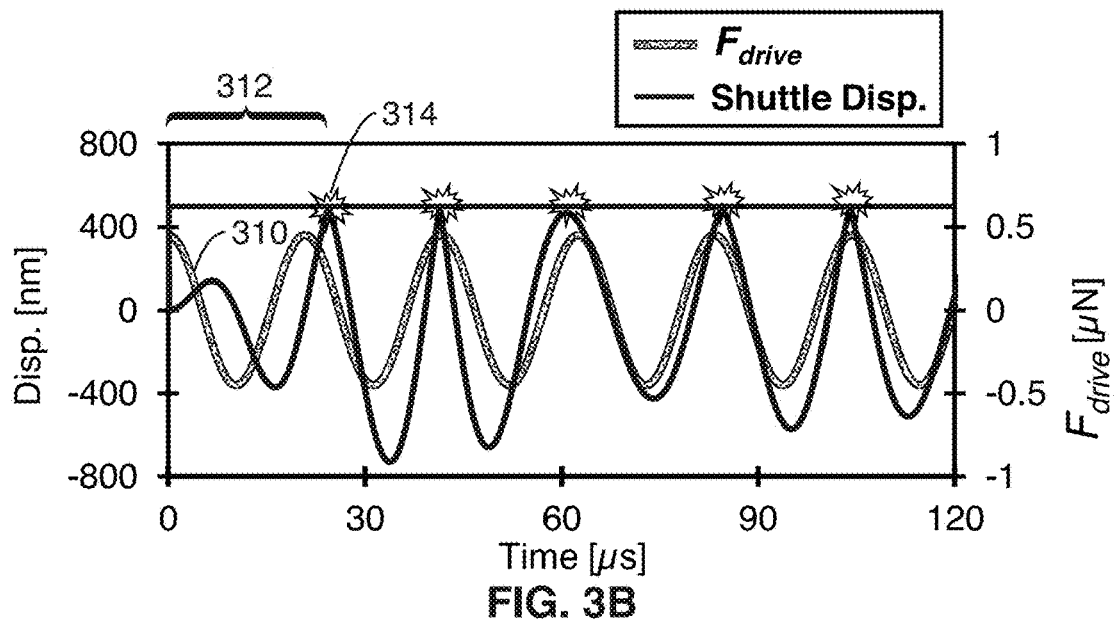
FIG. 3B

RF-POWERED MICROMECHANICAL CLOCK GENERATOR

CROSS-REFERENCE TO RELATED APPLICATIONS

This application claims priority to, and is a 35 U.S.C. § 111(a) continuation of, PCT international application number PCT/US2017/029769 filed on Apr. 27, 2017, incorporated herein by reference in its entirety, which claims priority to, and the benefit of, U.S. provisional patent application Ser. No. 62/328,114 filed on Apr. 27, 2016, incorporated herein by reference in its entirety, and which claims priority to, and the benefit of, U.S. provisional patent application Ser. No. 62/333,182 filed on May 7, 2016, incorporated herein by reference in its entirety. Priority is claimed to each of the foregoing applications.

The above-referenced PCT international application was published as PCT International Publication No. WO 2017/189806 A1 on Nov. 2, 2017, which publication is incorporated herein by reference in its entirety.

STATEMENT REGARDING FEDERALLY SPONSORED RESEARCH OR DEVELOPMENT

This invention was made with government support under HR0011-15-2-0052, awarded by the Defense Advanced Research Projects Agency (DARPA). The government has certain rights in the invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to microelectromechanical systems (MEMS) resonators or "resoswitches", more particularly to MEMS resoswitches capable of direct radio frequency excitation, and still more particularly to MEMS resoswitches capable of 5 nW or less operating power.

2. Background Discussion

Traditional real time clock circuits consume about 1 µW of electrical power, or more, and further are only as accurate as the resonance circuit. Therefore, high accuracy clock signals are not readily available at low power, and are subject to thermal drift, vibrations, etc.

The widespread expectation that autonomous sensor networks will fuel massively accessible information technology, such as the Internet of Things (IoT), comes with the realization that huge numbers of sensor nodes will be required, perhaps approaching one trillion. Needless to say, besides cost, energy will likely pose a major constraint in such a vision. If sleep/wake strategies can adequately limit a given node's sensor and wireless power consumption, the power bottleneck then reduces to the real-time clock (RTC) that synchronizes sleep/wake cycles. With typical RTC battery consumption on the order of 1 µW, a low-cost printed battery with perhaps 1 J of energy would last only 11.5 days. On the other hand, if a clock could bleed only 10 nW from this battery, it would last 3 years.

BRIEF SUMMARY

This disclosure describes a clock that can be turned on and off at will via a radio frequency (RF) signal and that consumes zero quiescent power when off.

In one embodiment, the clock utilizes a microelectromechanical system (MEMS) resonator ("resoswitch") to receive a modulated clock signal while consuming orders of magnitude lower power than electrical receiver counterparts.

In another embodiment, squegging is harnessed to convert received radio frequency (RF) energy (at −58 dBm) into a local clock output while consuming less than 17.5 nW of local battery power. The principal mechanism that enables conversion from a continuous wave input to a clock output is squegging of an impacting resoswitch, where impact-induced energy loss causes the resoswitch's resonating element to lose oscillation amplitude (hence stop impacting), then recover to impact again, in a periodic and repeatable fashion.

During these various impacts, the moving component of the resoswitch, the shuttle, closes an electrical circuit with an output electrode to change a charge state of a load capacitor. The resulting time domain waveform of the load capacitor charge state, with periodic peaks and valleys, then provides a stable frequency at a fraction of the RF input frequency that can then serve as a local on-board clock.

By dispensing with the need for a positive feed-back sustaining amplifier, a push-pull version of this RF-powered mechanical clock generator operates with only 50 pW of battery power driving a pico-probe with triangle-wave output, to be compared with the 1 µW of a typical low power real-time clock (RTC), which is more than 20,000 times lower power. The addition of an off-chip inverter to convert the triangle-wave output to a less noisy square-wave raises power consumption to 17.5 nW, which is still 57 times lower than the typical RTC. A demonstrated version of a single-ended RF-powered mechanical clock consumes 34.2 nW, which is still 28 times lower than the typical RTC.

Potential advantages and applications include, but are not limited to:

1. Ultra-low power oscillators for any clocking application. This basically replaces power hungry clocks in any electronic system. Obviously, this would serve a huge volume of products.

2. Clocking in harsh environments, e.g., radioactive, extreme heat, where conventional electronic clocks cannot operate, but this all-mechanical realization can.

3. Since this requires only a mechanical element, without a transistor circuit, this clock would be cheaper and smaller than anything out there, let alone its ability to operate with orders of magnitude less power. Both of these attributes of smaller and cheaper would then allow clocks in applications that could not previously have them, e.g., toys, belts, shoes, ingested medical pills, etc.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only:

FIG. 2B is a perspective view of a microelectromechanical system (MEMS) resoswitch and ancillary circuits that function as a filter-amplifier-demodulator in the block diagram of FIG. 2A.

FIG. 2C is a detailed top view of the output electrodes and the shuttle of the MEMS resoswitch of FIG. 2B as they approach and make contact.

FIG. 2D is a graph of amplitude versus time of a binary frequency shift keyed (BFSK) transmitted signal that follows a clock signal square wave.

FIG. 2E is a graph of the load capacitor $C_L$ charge state $V_{out}$ versus time for the input signal of FIG. 2D for the MEMS resoswitch of FIG. 2B.

FIG. 2F is a graph of the $V_{out}$ waveform of FIG. 2E versus time, after passing through the final inverter of FIG. 2B.

FIG. 3A is a graph of displacement versus time of the shuttle of the MEMS resoswitch of FIG. 2B.

FIG. 3B is a graph of displacement versus time of the shuttle of FIG. 2B with a higher input signal amplitude than that of FIG. 3A.

DETAILED DESCRIPTION

1. Introduction

The widespread expectation that autonomous sensor networks will fuel massively accessible information technology, such as the Internet of Things (IoT), comes with the realization that huge numbers of sensor nodes will be required, perhaps approaching one trillion. Needless to say, besides cost, energy will likely pose a major constraint in such a vision. If sleep/wake strategies can adequately limit a given node's sensor and wireless power consumption, the power bottleneck then concentrates on the real-time clock (RTC) that synchronizes sleep/wake cycles.

With typical RTC battery consumption on the order of 1 µW, a low-cost printed battery with perhaps 1 J of energy would last only 11.5 days. On the other hand, if a clock could bleed only 10 nW from this battery, it would last 3 years.

Pursuant to attaining such a clock, this technology explores a wireless approach that eliminates conventional closed-loop positive feedback design to realizing an RTC (along with its associated power consumption) and removes the need for a sustaining amplifier altogether.

Figure 1:
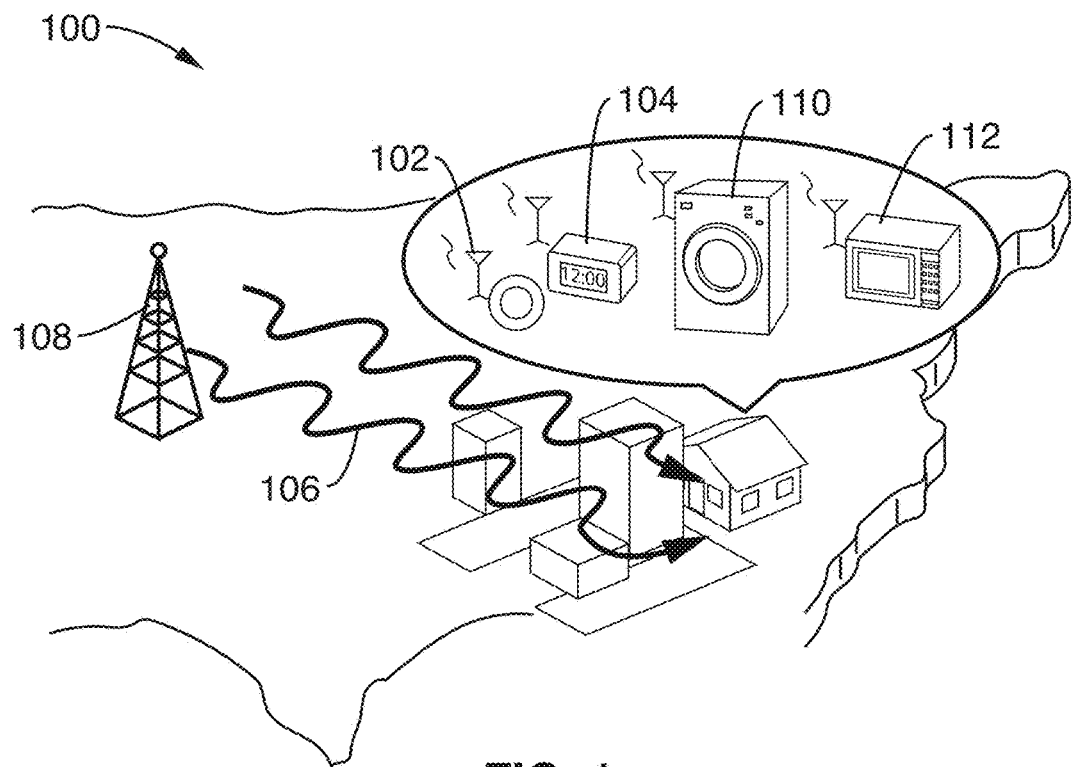
FIG. 1 is an Illustration of a wireless clock concept, where electronics and appliances receive clock signals remotely via ultra-low power mechanical receivers from transmitters sometimes thousands of kilometers away.

Refer now to FIG. 1, which is an Illustration 100 of a wireless clock vision, where instead of carrying power hungry local clocks based on positive feedback circuits, electronics 102 and clocks 104 receive clock signals 106 remotely via ultra-low power mechanical receivers from transmitters 108 located sometimes thousands of kilometers away. As long as the clock signal 106 frequencies are low enough, transmitted RF clock carriers can penetrate obstacles and travel over large distances, even cross-country. Additional appliances, such as washing machines 110, and microwaves 112 could also use the same wireless clock.

In this illustration, applications that employ RTC's (which include virtually every electronic device, from phones, to televisions, to appliances) would now no longer require positive feedback oscillator RTC's. Rather, radio frequency (RF) receiver circuits would replace the clocks, while base stations would supply the timing waveform remotely. If the carrier frequency used were sufficiently low, transmitted RF clock signals could penetrate buildings and other structures, even into some tunnels.

Additionally, existing infrastructure, such as AM or FM radio towers, could broadcast clock signals in addition to their usual content. If frequencies are low enough, e.g., WWVB signals already transmitted by NIST in Colorado, then cross-country transmission is even possible. For instance, WWVB broadcasts National Institute of Science and Technology timing signals on a 60 kHz carrier wave based on atomic clock standards, with a frequency uncertainty of less than 1 part in $10^{12}$.

Of course, receivers for WWVB signals already exist. However, unfortunately, they consume 300 µW of power when on and listening. This is much more than the 1 µW of the typical RTC and is obviously why the proposed FIG. 1 clock distribution scheme for everyday electronics is not presently desirable.

To address this problem, this technology explores the use of a MEMS-based RF receiver to eliminate quiescent power consumption and thereby greatly reduce the power needed to recover a clock waveform from a suitable RF input.

Figure 2A:
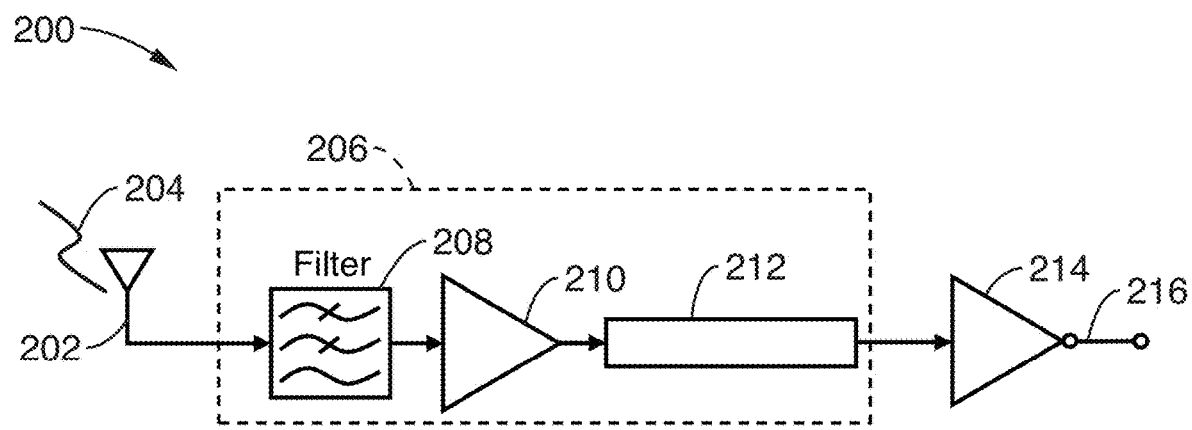
FIG. 2A is a block diagram of an RF-powered clock generator.

Refer now to FIG. 2A through FIG. 2F. FIG. 2A is a block diagram 200 of an RF-powered clock generator. Here, an antenna 202 receives radiated RF-power 204, which is then fed into a filter-amplifier-demodulator block 206 that contains at least a channel selection function 208, an amplifier 210, and a demodulator 212. Output from the filter-amplifier-demodulator block 206 is then optionally inverted 214 to provide a clock output signal 216. Note that the signal before the inverter can also serve as a clock output signal for some applications, therefore creating a transistorless implementation.

The RF-powered clock generator of FIG. 2A would use a MEMS resoswitch to realize the filter-amplifier-demodulator block 206 functionality required.

Refer now to FIG. 2B, which is a perspective view 218 of a MEMS resoswitch 220 and ancillary circuits that function as a filter-amplifier-demodulator block 206 in FIG. 2A. The antenna here is shown as a voltage source 222. This source 222 is coupled 224 to the resoswitch 220. The resoswitch 220 is characterized by output electrodes 226, an anchor 228, that is connected via a folded spring 230 to a moving shuttle 232. The moving shuttle 232 in turn has contact points 234 that impact with the output electrodes 226. The anchor 228 is biased at $V_{DD}$. The moving shuttle 232 is driven by comb transducers 236 that are biased at $V_P$ and driven by the source 222. A final implementation of the MEMS resoswitch 220 would likely be around 180 microns by 220 microns.

The clock generator specifically employs a MEMS resoswitch 220 as a filter and low noise amplifier (LNA) combination to first absorb an incoming frequency shift keyed (FSK) signal energy at its resonance frequency, block other radio frequency (RF) components not at resonance, and then convert the FSK waveform to a lower frequency clock waveform.

Additional information regarding the details of MEMS resoswitch design may be found in U.S. Pat. No. 9,431,201, which is hereby incorporated by reference in its entirety.

The source 222 receives the clock-modulated RF BFSK signal, which the MEMS resoswitch 220 then filters, amplifies, and demodulates to produce an output voltage $V_{out}$ 238. A final inverter 240 shapes an output voltage $V_{out}$ 238 to remove unwanted amplitude noise components to produce a final output square wave local clock signal $V_{CLK}$ 242.

Unlike a conventional transistor receiver, this MEMS resoswitch 220 version consumes no direct current power while "listening" for a valid RF clock signal. When it receives the RF clock signal, it then generates the needed clock waveform with considerably less power than otherwise consumed by a positive-feedback real time clock (RTC) sustaining amplifier. The current demonstration using an off-chip inverter 240 with 10 pF gate capacitance and 7.5 pF internal chip capacitance consumes near zero power (only inverter leakage current) at rest; and only 34.2 nW when dynamically switching, which is 28 times lower than a typical RTC.

2. Design and Operation

Referring again to FIG. 2B, the RF-powered clock generator uses an all-mechanical receiver front-end that detects, amplifies, and demodulates clock-modulated RF input power; followed by an optional inverter that converts an otherwise triangle-wave output of $V_{out}$ 238 to a more perfect square wave clock output $V_{CLK}$ 242.

An important aspect to low power consumption lies in the use of a MEMS resoswitch 220 that demodulates and amplifies incoming RF energy via nonlinear mechanical impact switching while avoiding the deleterious effects commonly associated with nonlinear operation via high Q channel-selection. Specifically, front-end channel-selection removes unwanted interferers before they can generate spurious signals via interaction with system nonlinearities.

A. MEMS Resoswitch Receiver Front-End

The MEMS resoswitch 220 comprises a shuttle 232 suspended by four folded-beam springs 230 that ultimately anchor 228 to the substrate at the central locations shown. The shuttle 232 holds two capacitive-comb transducers 236 on each side capable of differentially driving the shuttle 232 structure into motion; and two contact points 234 that are protrusions with pointed tips, also one on each side, capable of impacting with output electrodes 226 when the shuttle 232 displacement exceeds the tip-to-electrode gap spacing.

Refer now to FIG. 2C, which is a detailed top view of the output electrodes 226 and the shuttle 232 as they approach and make contact. In the top half of FIG. 2C, impact has occurred because the shuttle 232 has made electrical contact with the output electrode 226. For reference, the dashed line view of the shuttle 232 is in the undriven rest position 244.

Refer now to FIG. 2B and FIG. 2C. When shuttle 232 impact occurs with the output electrode 226, the conductive shuttle 232 closes a switch between the power supply $V_{DD}$ and the output load capacitor $C_L$ node $V_{out}$ 238, delivering power from $V_{DD}$ to $C_L$ and charging it in the process. When impacting stops, the bleed resistor $R_{bleed}$ discharges $C_L$ to 0V. Both the charging and discharging process work to alter the charge state of the output load capacitor $C_L$.

In the lower half of FIG. 2C, the voltage source 222 is seen to be off of the resonance frequency of the MEMS resoswitch 220, thereby limiting the maximum excursion of the shuttle 232 such that contact with the output electrode 226 is not made.

Refer now back to FIG. 2B. In the actual envisioned circuit, an antenna picks up the input signal as a voltage source 222 and feeds it to a balun 224 that then generates differential voltages on the driving capacitive-comb transducers 236, which are also biased at a DC voltage $V_P$ to generate voltage drops of $(V_P-V_{DD})$ from comb-electrode to shuttle comb finger that amplify the force of any applied AC signal. (Note that since no DC current flows between the electrodes and shuttle, there is no DC power consumption.)

If the voltage source 222 input signal is off of the MEMS resoswitch 220 resonance frequency $f_0$, the shuttle 232 barely moves. If, on the other hand, the voltage source 222 is at resonance, the ensuing shuttle 232 oscillation amplitude rises by Q times, yielding for the displacement amplitude $$\chi_m = Q \frac{F_{drive}}{k_m} \quad (1)$$

where Q is the quality factor of the resonator; $k_m$ is the total stiffness of its suspending folded spring 230 beams; and $F_{drive}$ is the drive force exerted on the shuttle generated by the input signal applied to the comb finger transducers. This force takes the form $$F_{drive} = V_P \left(2 \frac{\partial c}{\partial x}\right) v_{in} \quad (2)$$

where $V_{in}$ is the magnitude of the differential input signal voltages at the drive electrodes; and $$\frac{\partial c}{\partial x}$$

is the change in comb-finger overlap capacitance per displacement for each (identical) capacitive-comb transducer. Once the displacement $x_m$ exceeds the gap between the shuttle and the output impact electrodes $d_o$, the shuttle collides with these electrodes in a periodic fashion and connects one output electrode to $V_{DD}$. Equating $x_m$ with $d_o$ yields the minimum resonance voltage amplitude needed to effect impact, which takes the form $$v_{min} = \frac{d_0 k_m}{Q V_P \left(2 \frac{\partial c}{\partial x}\right)} \quad (3)$$

The input voltage is converted to average input power using $$P_{in} = \frac{v_{in}^2}{2 R_x} \quad (4)$$

where $R_x$ is the motional resistance of the resonator, given by $$R_x = \frac{k_m}{2 \pi f_0 Q V_P^2 \left(2 \frac{\partial c}{\partial x}\right)^2} \quad (5)$$

yields for (power) sensitivity S $$S = \frac{2\pi f_0 k_m d_0^2}{Q} \quad (6)$$

Note that since the displacement $x_m$ for an on-resonance input force is Q times larger than for an off-resonance one, the shuttle only makes contact when detecting small RF signals within the resoswitch passband, i.e., at its resonance frequency. Hence, $C_L$ charges only upon reception of an on-resonance RF input, but otherwise discharges to 0V through bleed resistor $R_{bleed}$. So effectively, the resoswitch first channel-select filters the input signal, rejecting practically all out-of-channel power; amplifies any in-channel signal via impact switching to $V_{DD}$, sending power from $V_{DD}$ to the output electrode; and charges/discharges capacitor according to RF input temporal frequency changes and the bleed rate of $R_{bleed}$, all of which amounts to FM demodulation. In effect, the MEMS resoswitch 220 functions as a filter-LNA-demodulator function in one device.

B. Clock Generator

Refer now to FIG. 2D, which is a graph 246 of amplitude versus time of a binary frequency shift keyed (BFSK) transmitted signal 246 that follows a clock signal 248 square wave. Given the above description of MEMS resoswitch 220 operation described above in FIG. 2B, one input scheme (perhaps transmitted by a base station) that generates the desired square-wave clock output is the simple BFSK signal 246 that simply hops back-and-forth between an on-resonance mark frequency $f_{mark}$ (representing a '1') and an off-resonance space frequency $f_{space}$ (representing a '0') with a period corresponding to the desired clock rate $f_{CLK}$. Here, each time span at $f_{mark}$ induces impacts and charges $C_L$ to $V_{DD}$; while each time span at $f_{space}$ stops impacts, allowing $C_L$ to discharge to 0V via bleed resistor $R_{bleed}$; all resulting in a square wave with amplitude $V_{DD}$ and period governed by the originally modulating source clock. This means the accuracy of the demodulated (local) clock should be practically the same as that of the source clock, which could be extremely good.

C. Clock Stability

Refer now to FIG. 2E, which is a graph 252 of $V_{out}$ versus time for the input signal of FIG. 2D for the MEMS resoswitch of FIG. 2B. Although the received clock signal can be quite accurate, its stability is subject to numerous events. In particular, if the output signal is taken at the $V_{out}$ 238 node indicated in FIG. 2B, then for a given value of bleed resistance $R_{bleed}$ the output waveform might resemble the sawtooth 254 waveform shown, with fast rise times 256 and slow fall times 258. Here, consistency of the rising edge of each sawtooth governs to some extent the stability of the local clock.

Refer now to FIG. 2F, which is a graph 260 of the $V_{out}$ 254 waveform of FIG. 2E versus time, after passing through the final inverter 240 of FIG. 2B. This final $V_{out}$ 254 waveform 254 would then represent the output clock signal from the MEMS resoswitch of FIG. 2B. Presumably, the consistency of the rising edge 262 of the clock signal depends heavily on impact and charging dynamics.

Refer now to FIG. 3A, which is a graph 300 of displacement versus time of the shuttle 232 of FIG. 2B. Here, for example, three RF input signal 302 cycles 304 are required to achieve first impact 306, then any variance in the drive efficiency that changes the number of cycles required to impact would contribute to rise time changes, and hence instability.

Refer now to FIG. 3B, which is a graph 308 of displacement versus time of the shuttle 232 of FIG. 2B with a higher input signal 310 amplitude than that of FIG. 3A. If the drive force amplitude changes for any reason, the number of oscillations needed to instigate impacting could also change, as shown by comparing FIG. 3A with FIG. 3B. Here, in FIG. 3B, only a single cycle 312 of drive is required to achieve impact 314. In addition, any variance in electrical contact resistance upon impact would change the charging rate of $C_L$, hence change the rise time and again generate instability.

Figure 4:
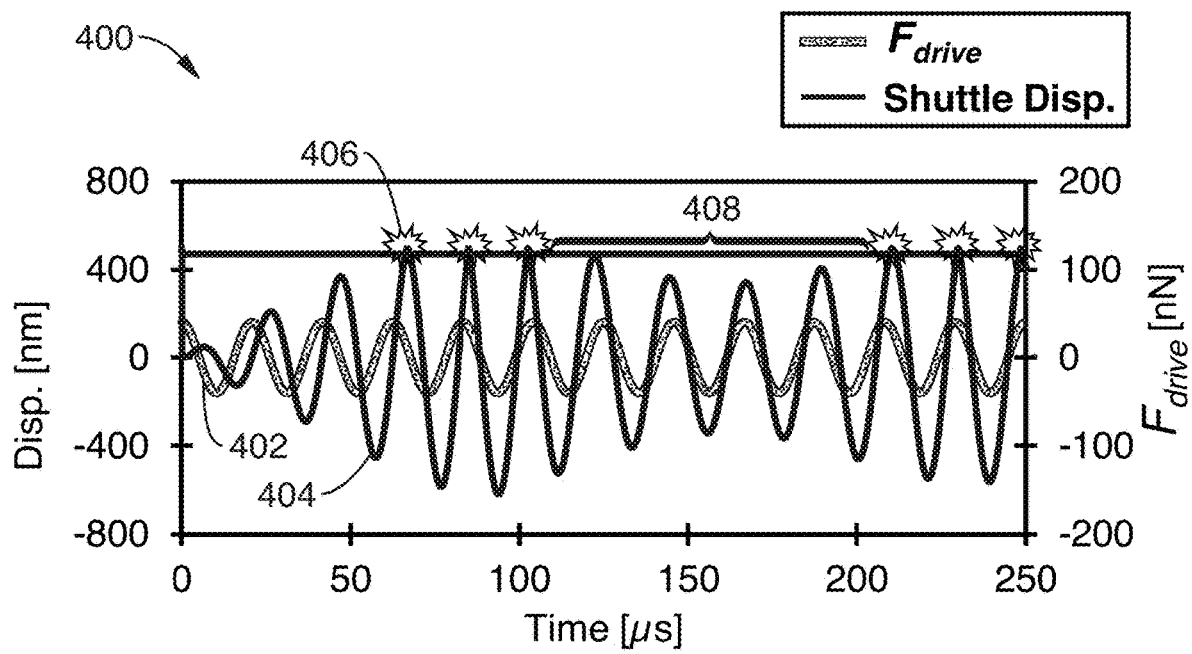
FIG. 4 is a graph of displacement versus time of the shuttle of FIG. 2B with a marginal input signal amplitude compared to that of FIG. 3A and FIG. 3B and plotted over a longer time span.

Refer now to FIG. 4, which is a graph 400 of displacement versus time of the shuttle 232 of FIG. 2B with a marginal input signal 402 amplitude compared to that of FIG. 3A and FIG. 3B. Here, the shuttle 232 displacement 404 of FIG. 2B is seen to be driven to impact 406 three successive times, only to miss the subsequent four driven cycles 408.

However, perhaps a more important source of instability to be noted would be that of squegging, where dephasing during collisions reduce the efficiency of the input drive force at resonance, resulting in undue energy loss in certain instances that then lead to missed impacts over small periods. The missed impacts of four driven cycles 408 duration is the result of squegging. Here, it $C_L$ discharges significantly during the non-impacting periods, and the resulting dip in output voltage ($V_{out}$ 238 of FIG. 2B) could generate an unexpected fall and rise instance, which could be logged as an off-frequency cycle that contributes to frequency instability.

More study into the sources of instability and on methods for controlling them will likely be the subject of ongoing research. Meanwhile, one quick way to improve stability is to speed up the rise time in order to reduce amplitude variation around the zero-crossing point of each cycle. Referring back to FIG. 2B, the amplification provided by the inverter 240 following $V_{out}$ 238 and delivering the output square-wave $V_{CLK}$ 242 improves stability.

D. Power Consumption of Bleed Resistor Version

The clock generator circuit of FIG. 2A through FIG. 2F is the actual circuit demonstrated experimentally and described below. Since it employs a bleed resistor $R_{bleed}$, this circuit consumes $(V_{DD})^2/R_{bleed}$ whenever its output is high. It still consumes zero power when it receives a space frequency input. This means that for a clock duty cycle of D, the average power consumption when driven by the described RF BFSK signal is $$P = C_L V_{DD}^2 f_{CLK} + \frac{V_{DD}^2}{R_{bleed}} D \quad (7)$$

that depends on the size of $R_{bleed}$. As an example, if $V_{DD}$=1V, $R_{bleed}$=30MΩ, D=50%, $f_{CLK}$=1 kHz, and $C_L$=17.5 pF, the power consumption would be 34.2 nW, which is much smaller than the 1 μW of a typical real time clock (RTC). However, 34.2 nW is nowhere near the lowest power consumption achievable via this technology.

E. Lower Power Consumption Push-Pull Version

Figure 5A:
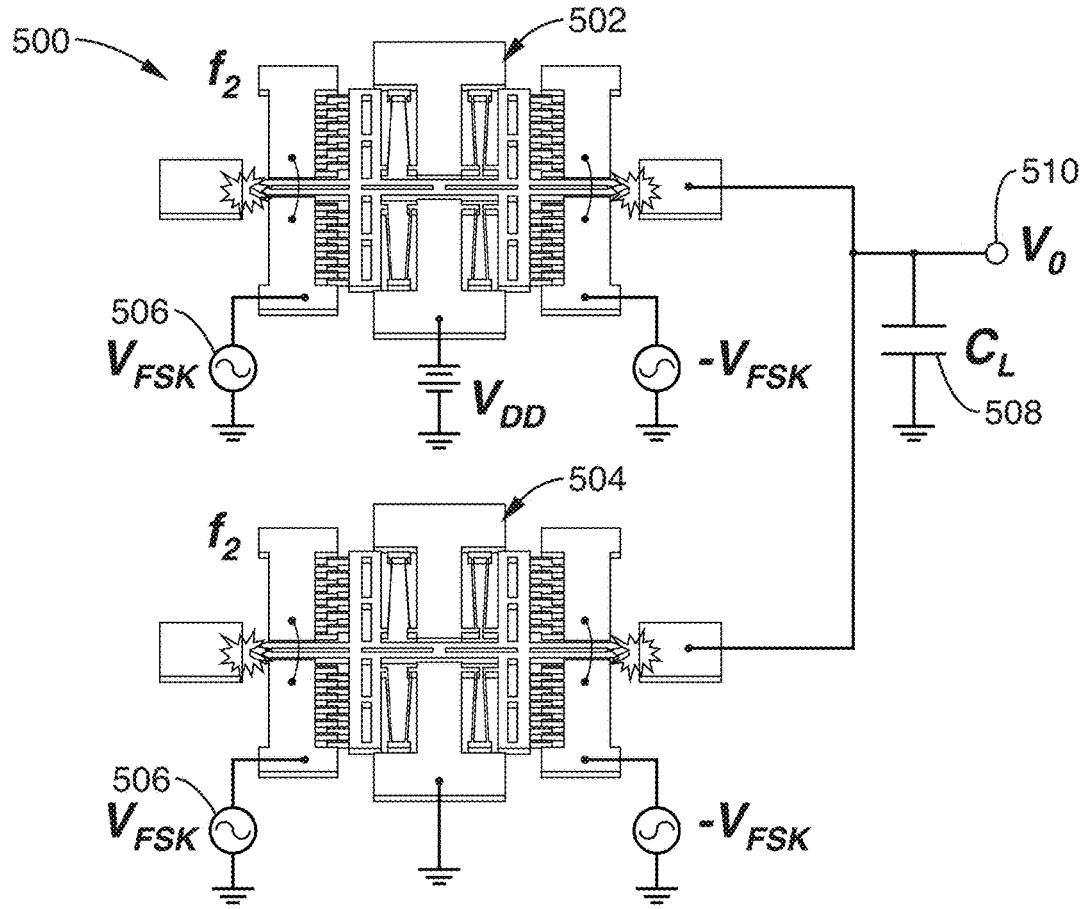
FIG. 5A is a schematic view of two resoswitches used together to provide an even lower power consumption clock generator by using an upper and lower resoswitch arranged in a push-pull circuit topology.
Figures 5B, 5C:
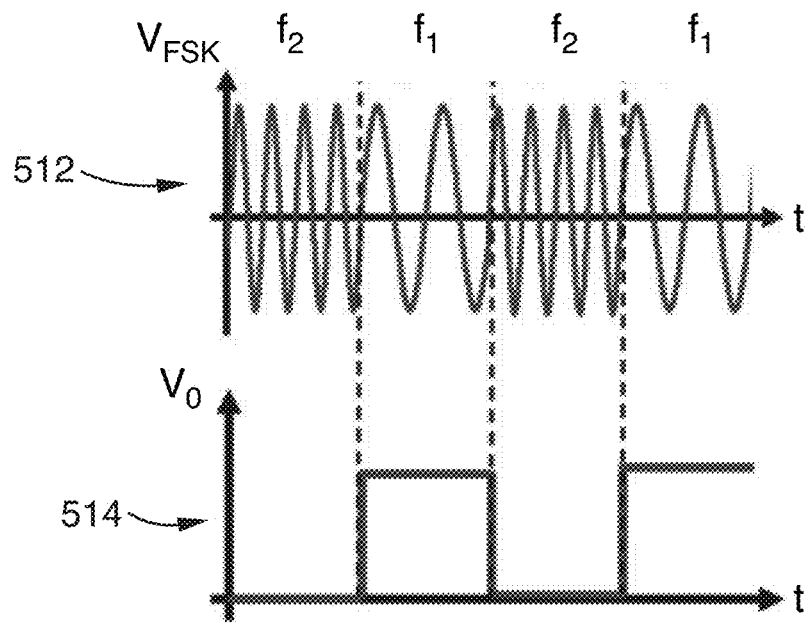
FIG. 5B is a set of compound graphs of BFSK input signal $V_{FSK}$ versus time, correlated with the $V_o$ output clock signal of FIG. 5A.
FIG. 5C is a table of other combinations of voltage, frequency, and capacitance, and their resultant power consumptions for the MEMS resoswitch of FIG. 2B.

Refer now to FIG. 5A-FIG. 5C. In FIG. 5A, which is a schematic 500 view of two resoswitches used together to provide an even lower power consumption clock generator by using an upper 502 and lower 504 resoswitches arranged in a push-pull circuit topology.

Here, the upper resoswitch 502 operates with resonance at the mark frequency $f_1$ and shuttle connected to VIM; and the lower 504 resoswitch operates with resonance at the space frequency $f_2$ and its shuttle connected to ground. Both the upper 502 and lower 504 resoswitches receive the BFSK input signal 506 with both their outputs tied to $C_L$ 508 to produce an output clock signal of $V_o$ 510.

On the mark cycle, the lower 504 resoswitch is stationary, while the upper 502 resoswitch impacts its output electrode to deliver charge from $V_{DD}$ to $C_L$, charging it to $V_{DD}$, i.e., to an output '1'.

On a space cycle, the upper 502 resoswitch is stationary, while the lower 504 resoswitch impacts its output electrode, connecting the output terminal to ground, which then discharges $C_L$ to ground. As the BFSK input signal 506 alternates between mark and space frequencies, a square wave ensues, as shown.

Refer now to FIG. 5A and FIG. 5B, where FIG. 5B is a set of compound graphs of BFSK input signal 506 $V_{FSK}$ versus time 512, correlated 514 with the $V_o$ 510 output clock signal of FIG. 5A.

The power consumption (i.e., $V_{DD}$) of the FIG. 5A clock generator now no longer contains a constant bleed resistor $R_{bleed}$ term, but rather depends strongly on the load capacitance $C_L$ 508 and takes the form $$P = C_L V_{DD}^2 f_{CLK} \quad (8)$$

From Eq. (8), power consumption decreases with reductions in any of $C_L$, $V_{DD}$, and/or $f_{CLK}$. Using Eq. (8) while assuming a typical on-chip inverter gate capacitance of 5 fF, the circuit of FIG. 5A with $V_{DD}$=1V and a clock frequency $f_{CLK}$=1 kHz consumes only 5 pW. This would last 6,342 years on only 1 J of energy.

If, on the other hand, an off-chip inverter were used with 10 pF of gate capacitance and 7.5 pF internal chip capacitance during dynamic switching, the power consumption at the same $V_{DD}$ and frequency would be 17.5 nW. This would still last a reasonable 1.8 years on 1 J. If the clock frequency were reduced to 1 Hz (for a 1 second period), then only 17.5 pW would be needed, and the clock would again last quite long on 1 J; 1,812 years, to be exact.

Refer now to FIG. 5C, which is a table 516 of other combinations of voltage, frequency, and capacitance, and their resultant power consumptions.

3. Coded RF-Powered Clock Demonstration

Refer now to FIG. 6A through FIG. 6D. Resoswitch clock receiver/generators were fabricated via the one-mask electroplated-gold surface micromachining process summarized below.

Figure 6A:
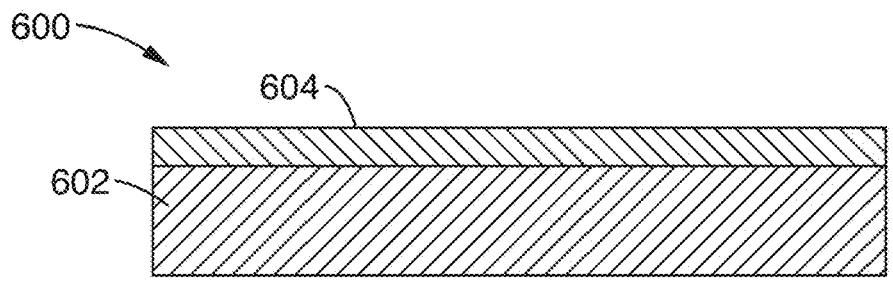
FIG. 6A is a cross section of a resoswitch under construction.

Refer now to FIG. 6A, which is a cross section 600 of a resoswitch under construction. Initially, on a base, which may be a typical silicon wafer substrate 602, a sacrificial layer 604 is deposited.

Figure 6B:
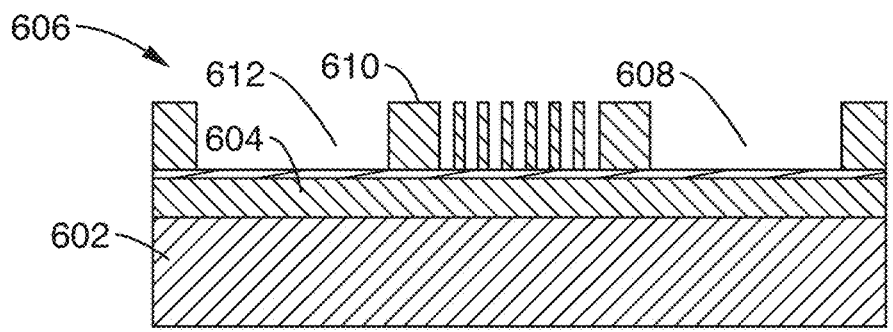
FIG. 6B is a cross section of the resoswitch under construction of FIG. 6A, where a seed layer has been deposited, after which a one mask mold has been deposited, with the unneeded regions removed.

Refer now to FIG. 6B, which is a cross section 606 of the resoswitch of FIG. 6A under construction. Here, a seed layer 608 is deposited, after which a one mask mold 610 is deposited, with the unneeded regions 612 removed.

Figure 6C:
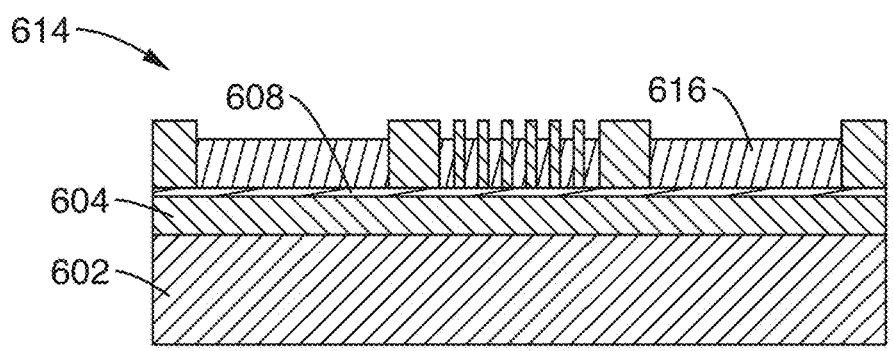
FIG. 6C is a cross section of the resoswitch under construction of FIG. 6A and FIG. 6B, where gold has been plated onto the seed layer

Refer now to FIG. 6C, which is a cross section 614 of the resoswitch of FIG. 6B under construction. Here, gold has been plated 616 onto the seed layer 608.

Figure 6D:
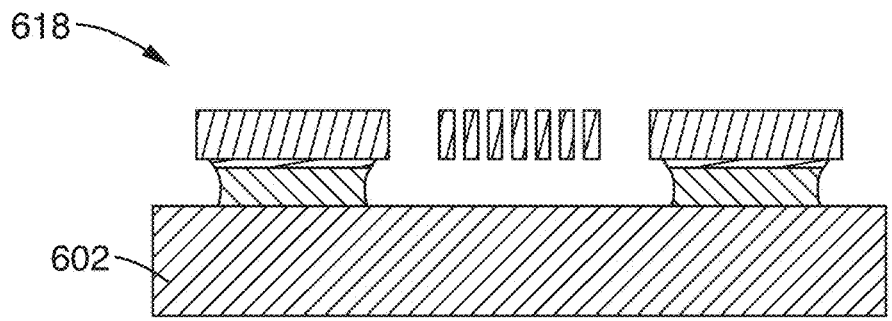
FIG. 6D is a cross section of the resoswitch under construction of FIG. 6A through FIG. 6C, where the one mask mold and seed layer not beneath the gold plate have both been removed.

Refer now to FIG. 6D, which is a cross section 618 of the resoswitch of FIG. 6C under construction. Here, the one mask mold 610 and seed layer 608 not beneath the gold plate 616 have both been removed.

Figure 7A:
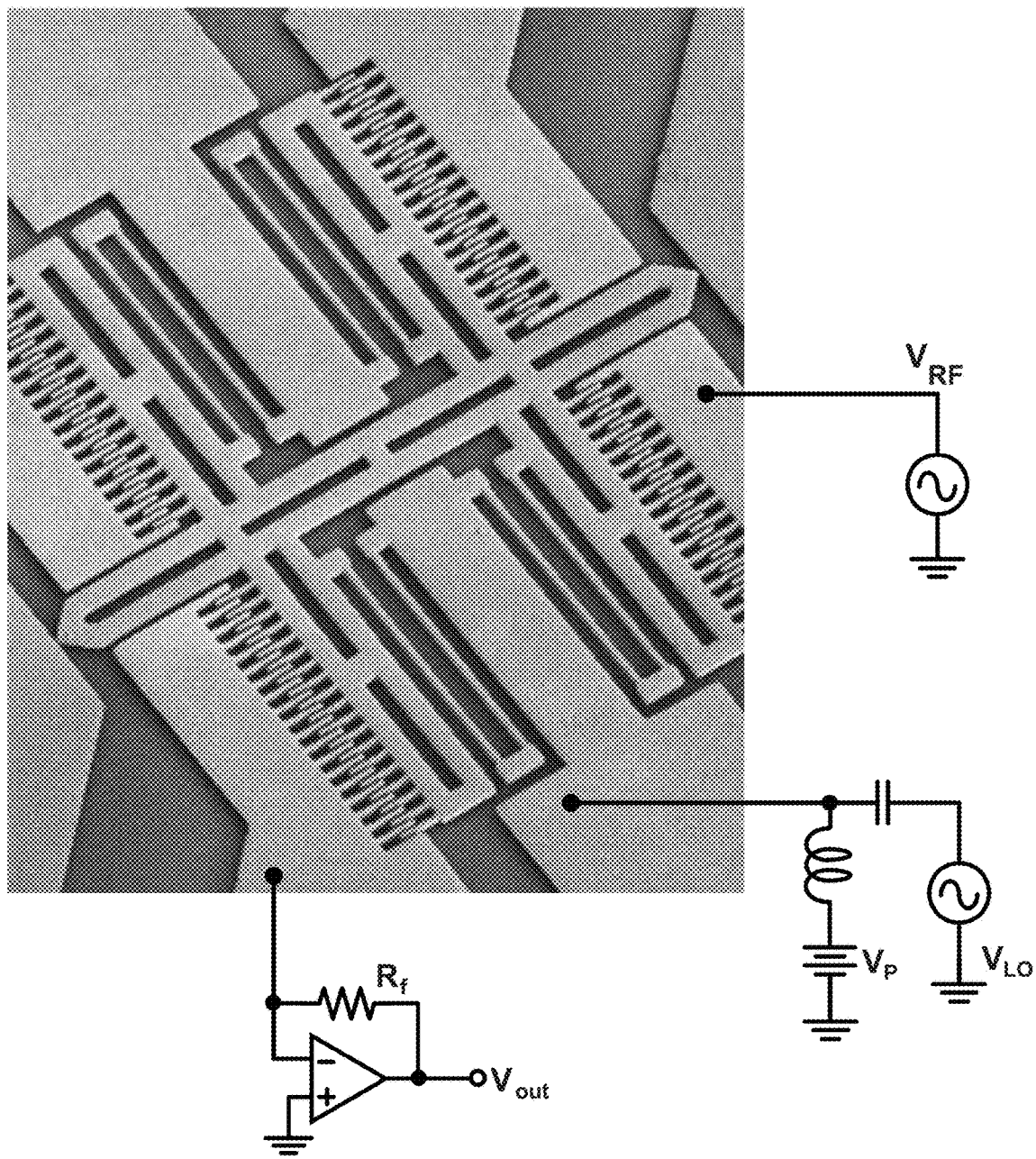
FIG. 7A is a scanning electron microscope (SEM) of a 20-kHz version of the MEMS resoswitch produced via the steps of FIG. 6A through FIG. 6D, in combination with miscellaneous circuit components.

Refer now to FIG. 7A, which is a combination 700 of a SEM of the resoswitch produced via the steps of FIG. 6A through FIG. 6D, in combination with miscellaneous circuit components. Here, the resoswitch imaged is that of a 20 kHz version.

For testing, a Lakeshore FWPX probe station provided a 1 mTorr vacuum environment under which resoswitches were first characterized and then operated as RF clock receivers.

Figure 7B:
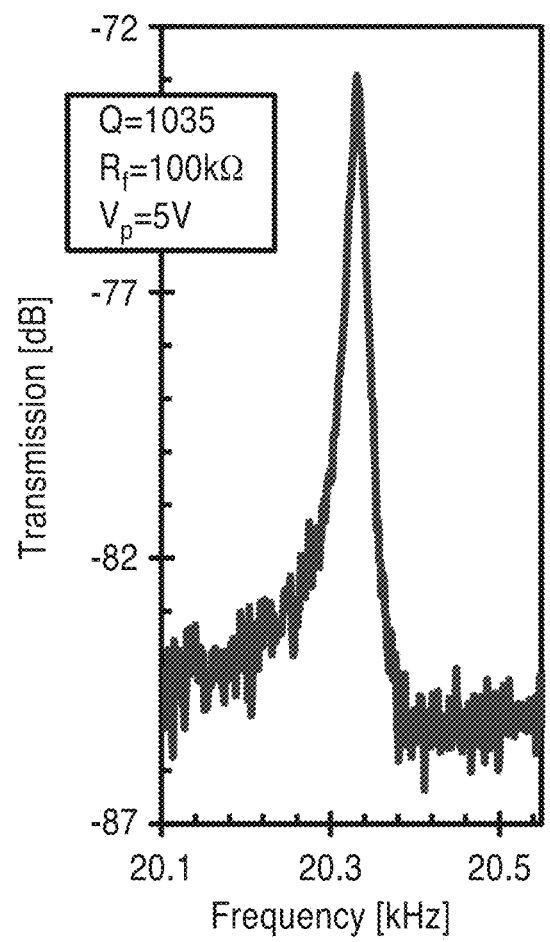
FIG. 7B is a graph of signal transmission versus frequency for a typical gold resoswitch measured by using a mixing method to eliminate interference from unwanted parasitics.

Refer now to FIG. 7B, which is a graph 702 of signal transmission versus frequency for a typical gold resoswitch measured using a mixing method to eliminate interference from unwanted parasitics. The measured Q of 1,035 is not nearly as high as the 50,000 normally exhibited by similar devices in polysilicon, but is on par with typical numbers posted by resonators constructed of gold as the structural material.

A. RF Clock Receiver Demonstration

To demonstrate RF-powered clock operation, a fabricated resoswitch within the vacuum environment was first hooked into the circuit of FIG. 2B, then excited by an HP 33120A Waveform Generator providing a clock-modulated BFSK signal with appropriate mark and space frequencies.

Figure 8A:
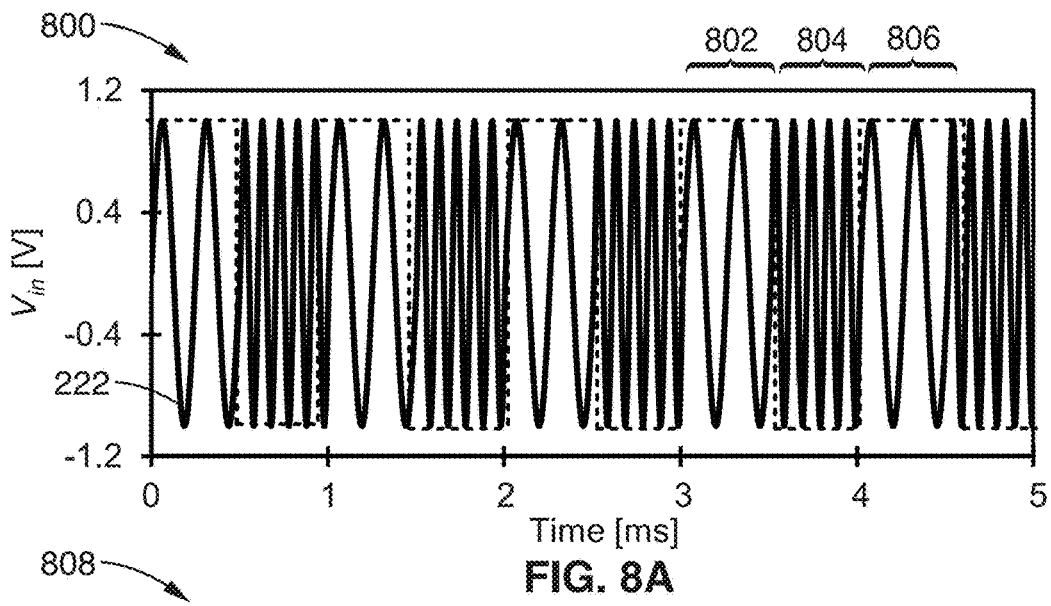
FIG. 8A is a graph of input signal versus time of measured waveforms at various points labeled in the circuit of FIG. 2B.
Figure 8B:
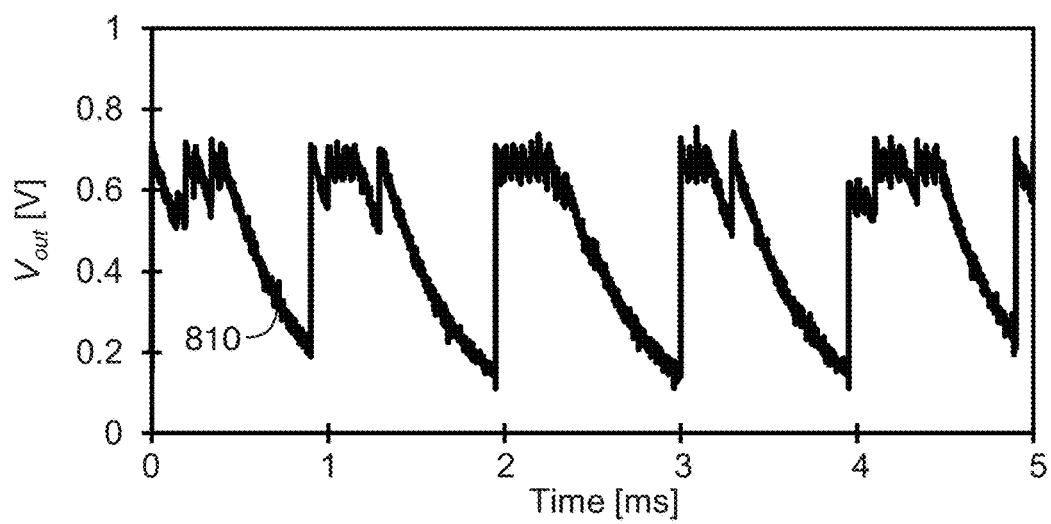
FIG. 8B is a graph of the measured output voltage $V_o$ versus time.
Figure 8C:
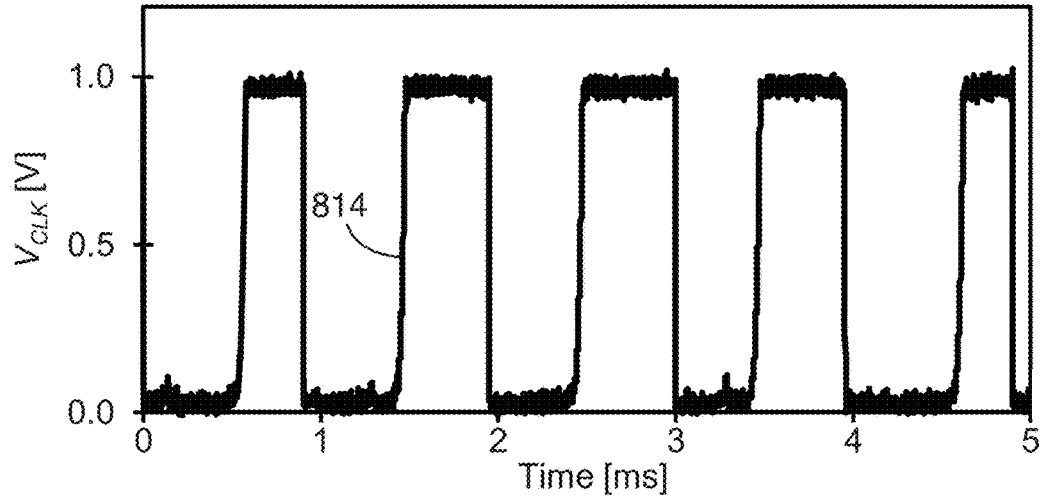
FIG. 8C is a graph of the measured local output clock signal $V_{CLK}$ versus time.

Refer now to FIG. 2B, as well as FIG. 8A through FIG. 8C. FIG. 8A is a graph 800 of input signal versus time of measured waveforms at various points labeled in the circuit of FIG. 2B when excited by a clock-modulated BFSK RF signal as the voltage source 222. As shown, the −58 dBm BFSK input signal acts as the voltage source 222, with alternating mark 802 and space 804 frequencies (respectively $f_{mark}$ and $f_{space}$) of 20 kHz and 50 kHz, respectively, that drive the MEMS resoswitch 220 shuttle 232 to impact the output electrodes 226 during the half period when the input is at 20 kHz, under which the output voltage shown in FIG. 8B rises to $V_{DD}$.

For the following input signal half period of 50 kHz, shuttle 232 impacts stop and the output voltage $V_{out}$ 238 discharges to zero. The alternating mark 802 and space 804 frequencies are indicated by the input clock waveform 806 that drives the $f_{mark}$ and $f_{space}$.

FIG. 8B is a graph 808 of the measured 810 output voltage $V_{out}$ 232 for the voltage source 222 versus time. The waveform of output voltage $V_{out}$ 238 in FIG. 8B could already serve as a clock signal, and if acceptable, would allow clock generation without need for an output final inverter 240. For more demanding applications, addition of a single final inverter 240 provides a cleaner square-wave with less amplitude noise.

FIG. 8C is a graph 812 of the measured 814 local output clock signal $V_{CLK}$ 240 versus time. FIG. 8C presents the measured final output clock waveform delivered by a simple off-chip Texas Instruments SN74AHC inverter, which consumes 7.5 nW of battery power, for a total (with $C_L$ charging) of 34.2 nW.

Ultimately, the measured 814 local clock output in FIG. 8C mimics the original modulating source clock waveform of FIG. 8A, confirming RF-powered local clock generation exactly as previously described.

B. Allan Deviation Measurements

Figure 9:
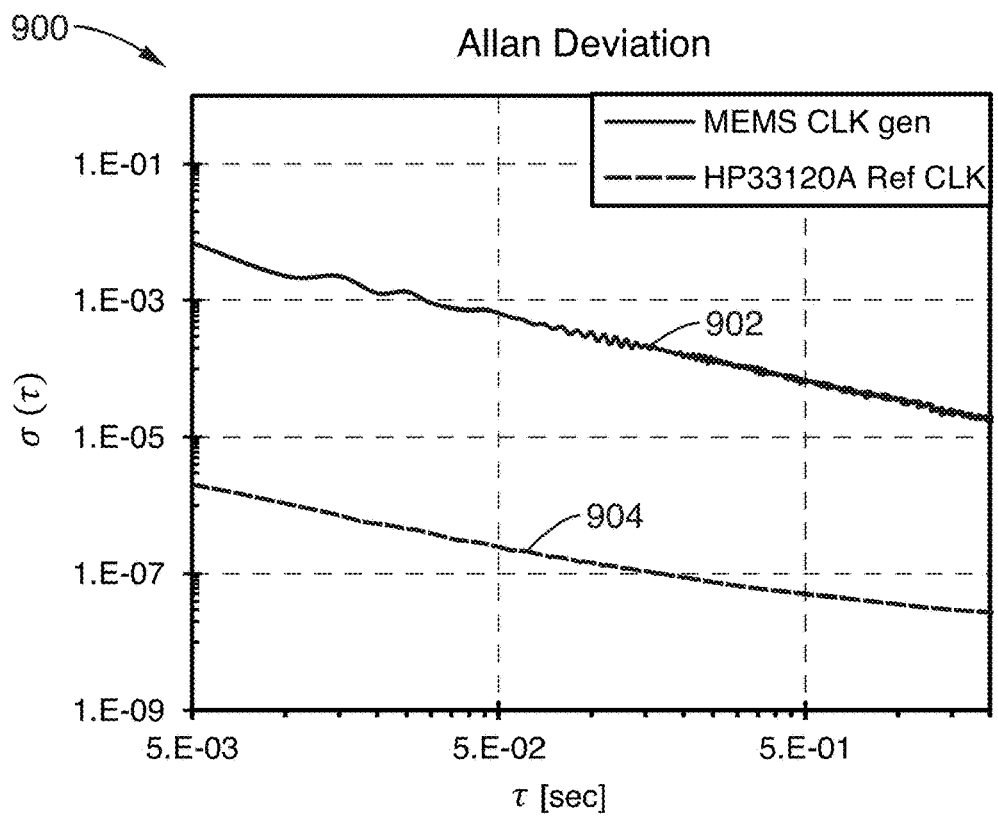
FIG. 9 is a graph of the Allan variance of the MEMS resoswitch local clock signal $V_{CLK}$ of FIG. 2B versus the input clock originally used to generate the BFSK voltage source.

Refer now to FIG. 2B and FIG. 9. FIG. 9 is a graph 900 of the Allan deviation of the MEMS resoswitch 220 local clock signal $V_{CLK}$ 242 of FIG. 2B 902 versus that of the input clock 904 originally used to generate the BFSK voltage source 222. This measurement allows a gauge of the stability of the received and down-converted local clock.

Here, FIG. 9 presents the preliminary measurements of Allan deviation for the down-converted local clock when excited by an RF BPSK voltage source 222 signal modulated by an HP33120A Waveform Generator against that of the reference clock used to modulate the input RF carrier. Clearly, the stability of the local clock signal is poorer than that of the reference clock. This is not unexpected given the stability discussion of Section II.C above.

Figure 10:
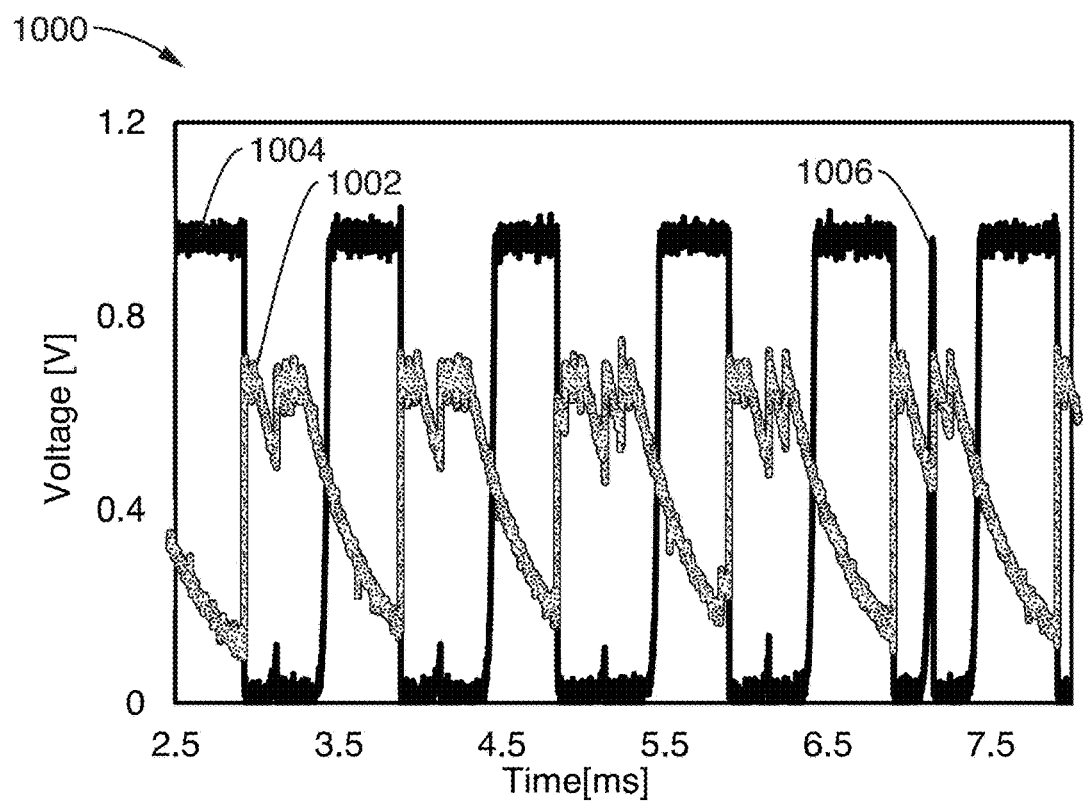
FIG. 10 is a graph of voltage versus time of the output voltage $V_{out}$ of FIG. 2B, and the final output square wave local clock signal $V_{CLK}$ measured on the MEMS resoswitch of FIG. 2B.

FIG. 10 is a graph 1000 of voltage versus time of the output voltage $V_{out}$ 238 of FIG. 2B, and the final output square wave local clock signal $V_{CLK}$ 242 measured on the MEMS resoswitch 220 of FIG. 2B. To explore the hypothesis of Section II.C that squegging can contribute to instability, FIG. 10 presents an oscilloscope snapshot of a few representative clock cycles at the $V_{out}$ 1002 and $V_{CLK}$ 1004 nodes of FIG. 2B. Here, squegging leads to occasional missed impacts, which then inserts unexpected fall and rise transitions 1006, hence alters the frequency over this instance and compromises clock stability. The missed impacts cause the output curve to drop too low, which then trigger the inverter to output a high when it should be outputting a low. This inserts an unexpected clock transition, which destabilizes the frequency.

Figure 11A:
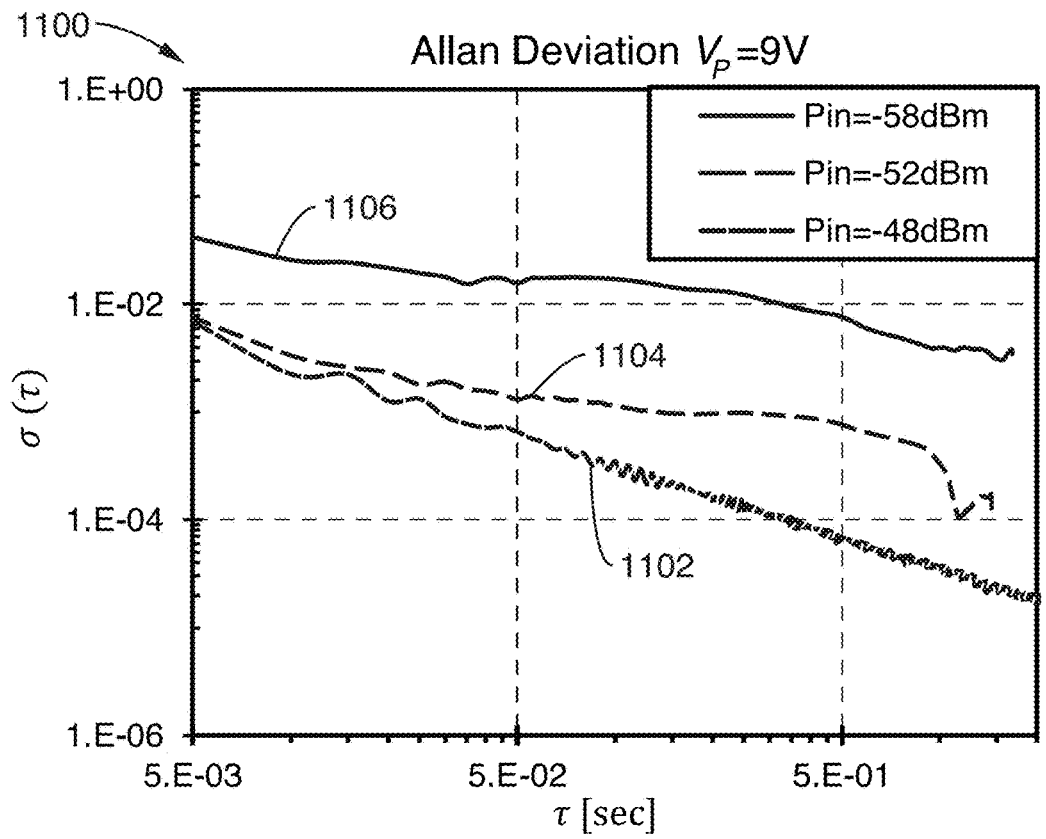
FIG. 11A is a graph of the Allan deviation for varying values of input drive power $P_{in}$ with a constant DC-bias $V_P$ at 9V for the MEMS resoswitch of FIG. 2B.
Figure 11B:
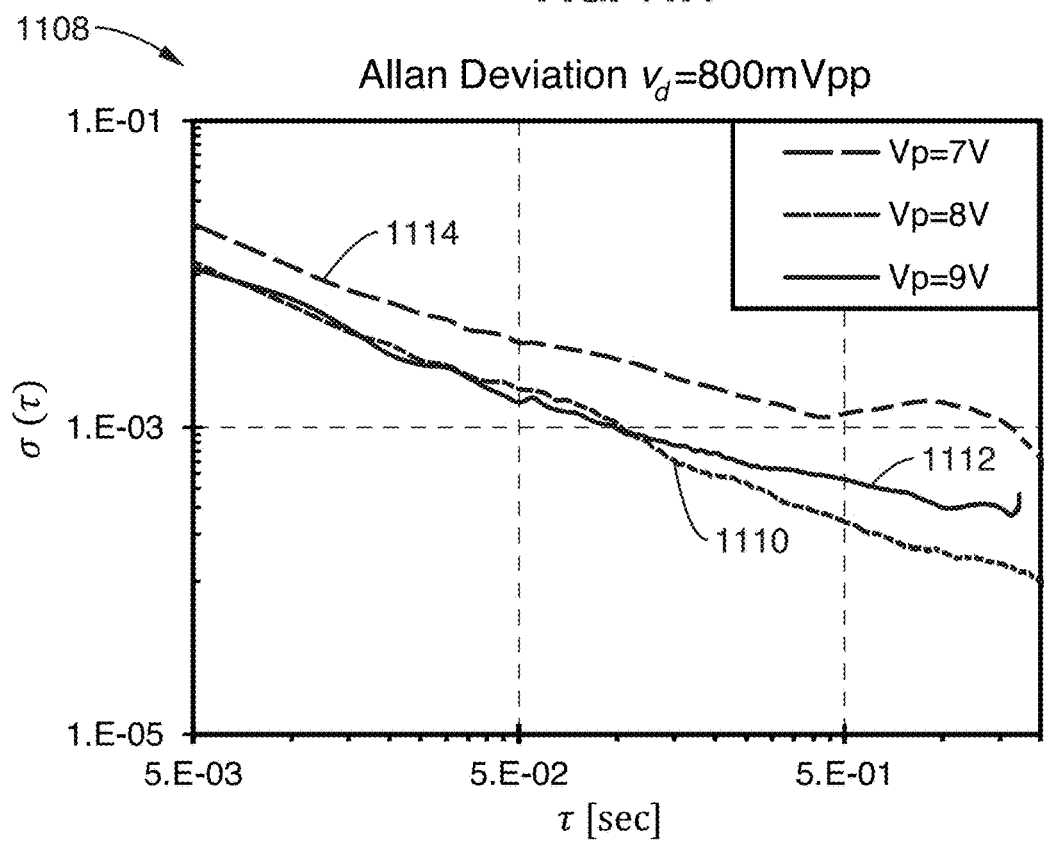
FIG. 11B is a graph of Allan deviation dependence on DC-bias with bias points taken at 7, 8, and 9V.

Refer now to FIG. 11A through FIG. 11B. FIG. 11A is a graph 1100 of the Allan deviation for varying values of input drive power $P_{in}$ with a constant DC-bias $V_P$ at 9V for the MEMS resoswitch 220 of FIG. 2B. Here, the Allan deviation response of the local RF-powered clock is graphed at three input power levels: $P_{in}$ at −48 dm 1102, $P_{in}$ at −52 dBm 1104, and $P_{in}$ at −58 dBm 1106. Optimal performance is seen at the highest power $P_{in}$ at −48 dm 1102, with successively worse performance for lower input power levels of $P_{in}$ at −52 dBm 1104, and $P_{in}$ at −58 dBm 1106.

Given that larger drive voltage reduces squegging, the improvement in Allan deviation with increasing drive voltage seen in FIG. 11A does further attest to a squegging-based mechanism for instability.

Refer now to FIG. 11B, which is a graph 1108 of Allan deviation local clock dependence on DC-bias with bias points taken at 8 (1110), 9 (1112), and 7V (1114). In FIG. 11B, it is less conclusive that higher bias increases local clock performance, although there does seem to be a sweet spot at 8V 1110 where Allan deviation is best.

That squegging might be the principal reason for clock instability is actually encouraging, since recent research has identified methods by which squegging can be reduced. These include the use of a symmetric drive (which the FIG. 2B device already uses), reduction of the output impact gap, and the use of soft or compliant impact electrodes. Work to incorporate these fixes into future resoswitch clock designs is underway, which should lead to significant stability improvements.

4. Coded RF-Powered Clock Closing Remarks

The 34.2 nW of battery power used by the demonstrated RF-powered mechanical clock is already 28 times smaller than the typical 1 μW RTC. If an on-chip inverter (with much less capacitance) was available and a push-pull topology used, the total dynamic power consumption could potentially drop to only 5 pW, which is 15,000 times smaller. Since this power value would allow a 1 J printed battery to last more than 6,000 years, battery self-discharge would more likely determine ultimate lifetime.

Although the demonstrated clock shares the accuracy of the modulating source clock, there are sources of instability that compromise the short-term performance of the local generated clock. Among the list of possible destabilizing phenomena, squegging seems to dominate in the demonstrated prototype. That squegging is the main culprit is somewhat encouraging, since it means there is opportunity for improvement, especially given the approaches to reducing resoswitch squegging already in the literature.

5. CW-Powered Squegging Micromechanical Clock Generator

The previous sections introduced an RF-powered micromechanical clock generator that dispenses with the conventional transistor-based positive feedback oscillator approach to successfully reduce power consumption down to 34 nW.

Figure 12:
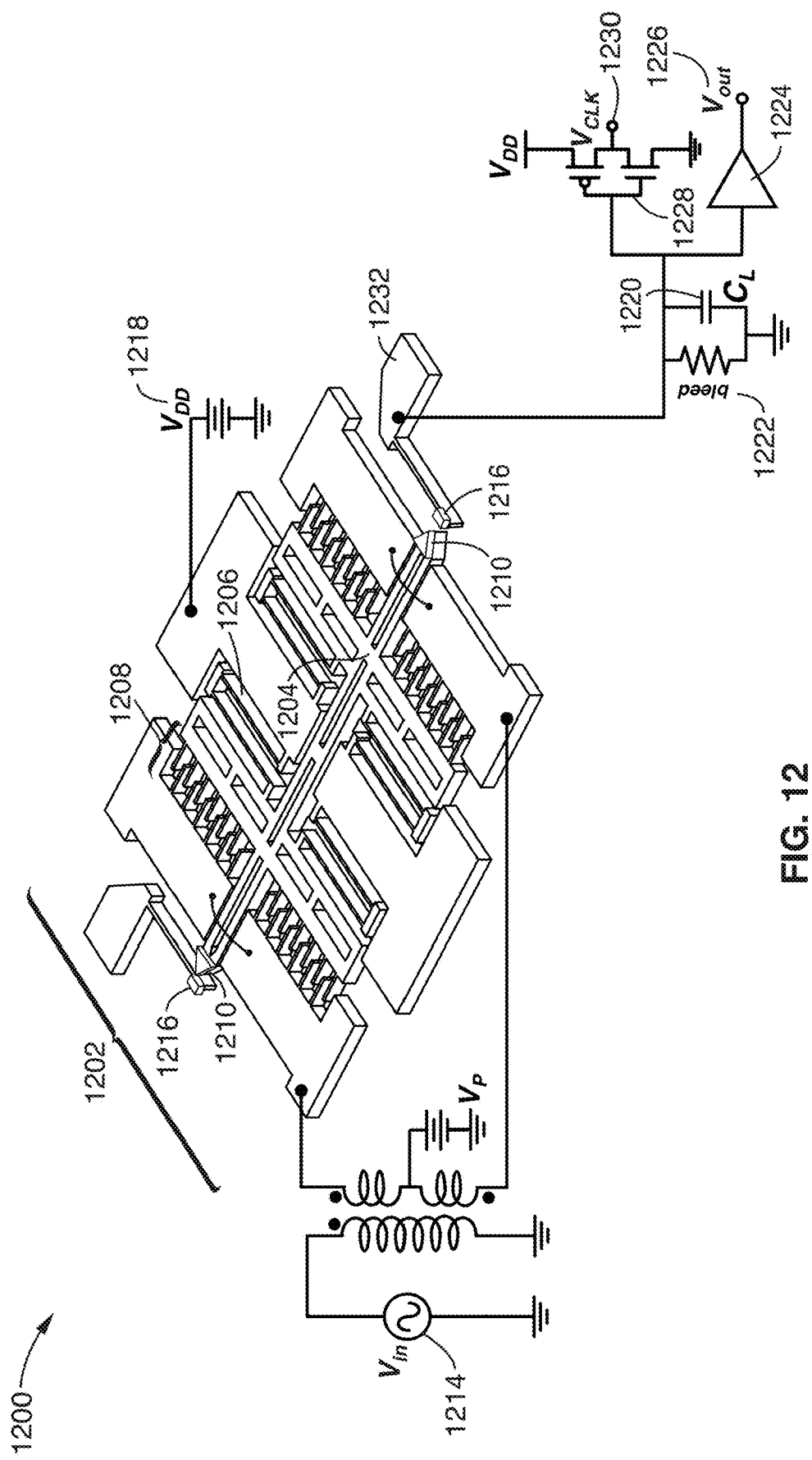
FIG. 12 is a perspective view of an alternative MEMS-based resoswitch with soft impact electrodes and ancillary circuits that function as a micromechanical clock generator designed as an all-mechanical receiver to detect and demodulate RF input energy.

Refer now to FIG. 12, which is a perspective view 1200 of an alternative MEMS-based resoswitch and ancillary circuits that function as a micromechanical clock generator designed as an all-mechanical receiver that detects and demodulates RF input energy.

The resoswitch 1202 comprises a polysilicon movable shuttle 1204 suspended by stress-relieving folded-beams 1206, flanked by capacitive-comb transducers 1208, and employing sharp metal protrusions 1210 to impact the indicated soft-impact output electrodes 1212. Once driven by an input $V_{in}$ 1214 to resonance at a sufficiently large amplitude, the shuttle 1204 protrusions 1210 impacts the output electrodes 1216, thereby closing a switch contact and delivering charge from the supply $V_{DD}$ 1218 to the output load capacitor $C_L$ 1220, charging it to $V_{DD}$ 1218. Bleeding down of $C_L$ 1220 is accomplished by $R_{bleed}$ 1222. The voltage of $C_L$ 1220 may be monitored by buffered 1224 output $V_{out}$ 1226. Additionally, the voltage of $C_L$ 1220 may be square-waved by field effect transistor (FET) inverter stack 1228 to produce a local clock output $V_{CLK}$ 1230.

The MEMS resoswitch 220 shown in the previous FSK clock generator of FIG. 2B operates in an on-off keying (OOK) fashion, where a mark input frequency $f_{mark}$ excites resonance impacts to generate voltage spikes at $f_{mark}$ that are rectified by $R_{bleed}$ 1218 and $C_L$ 1216 to yield a clock "high". Meanwhile, an off-resonance space frequency $f_{space}$ induces no motion, so no impacts, allowing $C_L$ 1216 to discharge via $R_{bleed}$ 1218, generating a clock "low", all of which are done with extremely low power consumption.

One drawback of the previous clock generator of FIG. 2B is the need for a clock-modulated RF waveform. For example, in a potential application where all RTCs receive clock activation energy wirelessly, it would be more easily implemented if the energy powering the clocks were not modulated, i.e., if it could be delivered as a simple continuous wave (CW) input.

The mechanical clock demonstrated in FIG. 12 uses squegging to convert −50 dBm of input CW energy into a local 1 kHz clock output while consuming only 1.3 nW of battery power when outputting a triangle-wave into 0.8 pF, which is 770 times lower than the 1 μW of a typical RTC.

6. CW Clock Generator

Refer again to FIG. 12. Except for use of a W/TiN contact protrusion metal instead of Au (for reasons to be described), the structure of the CW clock generator mimics that of the previous FSK one. Its operation, on the other hand, is quite different. Instead of functioning as a receiver that faithfully demodulates a received clock signal, the CW clock generator effectively 1) harvests the energy from a remote unmodulated CW input signal; then 2) uses the energy to instigate and facilitate generation of a stable clock signal from a local power source.

Figure 13A:
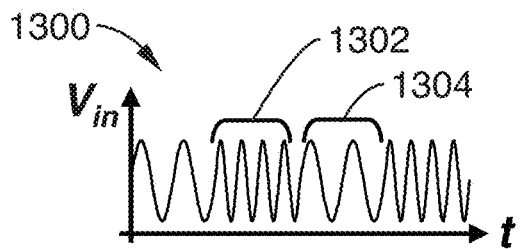
FIG. 13A is a graph of a frequency shift keyed (FSK) input voltage versus time supplied to the MEMS resoswitch of FIG. 12.
Figure 13B:
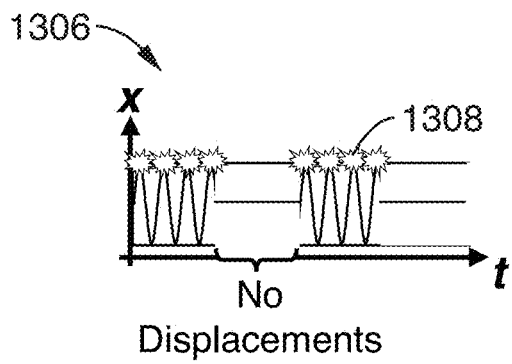
FIG. 13B is a graph of the shuttle displacement x versus time of FIG. 12 where the MEMS resoswitch shuttle makes a series of continuous impacts.
Figure 13C:
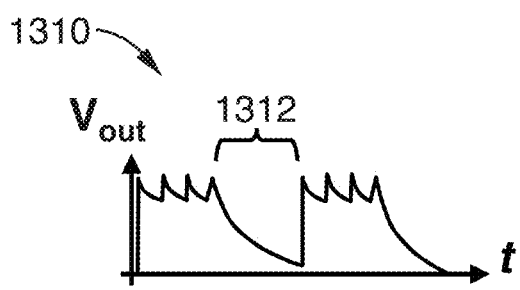
FIG. 13C is a graph of the output voltage $V_{out}$ due to the shuttle impacts of FIG. 13B, clearly showing that there are missed impacts where the shuttle has not impacted an output electrode.
Figure 13D:
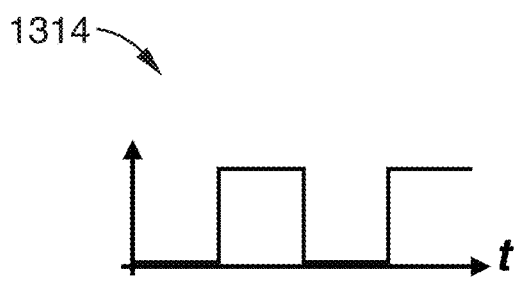
FIG. 13D is a graph of the local clock output $V_{CLK}$ generated from the buffered output of the $C_L$ voltage.

Refer now to FIG. 12, as well as FIG. 13A through FIG. 13D, which are waveforms at various locations in the MEMS resoswitch 1202. FIG. 13A is a graph 1300 of an FSK input voltage versus time supplied to the MEMS resoswitch 1202 as $V_{in}$ 1214. The FSK waveform is characterized by high frequency spaced $F_{space}$ 1302 and lower frequency marks $F_{mark}$ 1304. FIG. 13B is a graph 1306 of the shuttle 1204 displacement x versus time making a series of continuous impacts 1308. FIG. 13C is a graph 1310 of the output voltage $V_{out}$ 1226 due to the shuttle 1204 impacts of FIG. 13B, clearly showing that there are missed impacts 1312. Finally, FIG. 13D is a graph 1314 versus time of the local clock output $V_{clk}$ 1230 generated from the buffered output of the $C_L$ 1220 voltage.

Figure 14A:
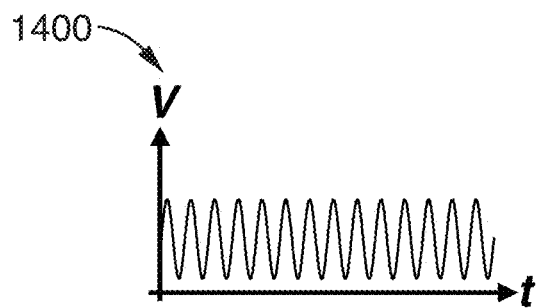
FIG. 14A is a graph of a continuous wave (CW) input voltage versus time supplied to the MEMS resoswitch of FIG. 12.
Figure 14B:
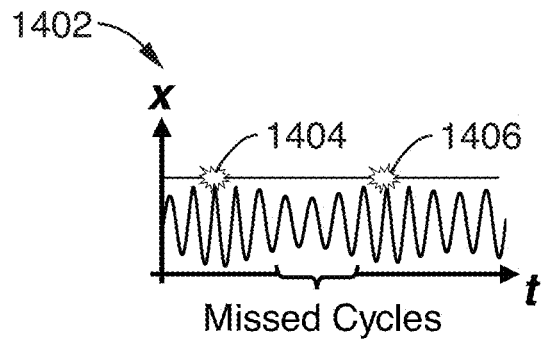
FIG. 14B is a graph of the shuttle displacement x versus time of FIG. 12 where the shuttle makes a series of discontinuous impacts due to squegging.
Figure 14C:
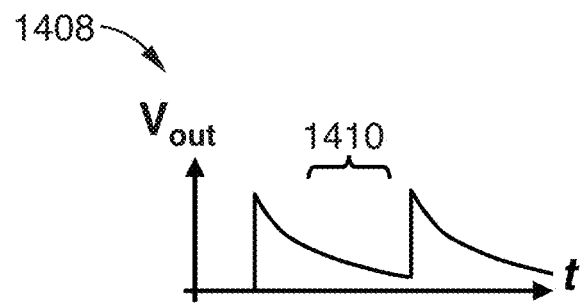
FIG. 14C is a graph of the output voltage $V_{out}$ due to the discontinuous shuttle impacts of FIG. 14B.
Figure 14D:
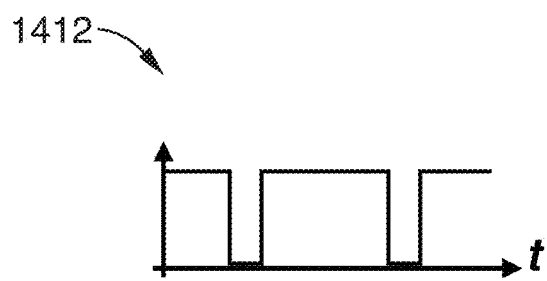
FIG. 14D is a graph of the local clock output $V_{clk}$ generated from the buffered output voltage $V_{out}$ of load capacitor $C_L$.

Refer now to FIG. 12, as well as FIG. 14A through FIG. 14D, which are waveforms at various locations in the MEMS resoswitch 1202. FIG. 14A is a graph 1400 of a continuous wave (CW) input voltage versus time supplied to the MEMS resoswitch 1202 as $V_{in}$ 1214. FIG. 14B is a graph 1402 of the shuttle 1204 displacement x versus time making a series of discontinuous impacts 1404, 1406 due to squegging. FIG. 14C is a graph 1408 of the output voltage $V_{out}$ 1226 due to the shuttle 1204 impacts 1404, 1406 of FIG. 14B, clearly showing missed CW cycles 1410. Finally, FIG. 14D is a graph 1412 of the local clock output $V_{clk}$ 1230 generated from the buffered output of the $C_L$ 1220 voltage of FIG. 14C.

To further expand on FIG. 14A through FIG. 14C, these graphs illustrate the overall operation of the CW clock generator. As with the FSK-input version previously summarized in FIG. 13A through FIG. 13D, the CW-input version receives energy via $V_{in}$ 1214 of FIG. 12, but this time as FIG. 14A an unmodulated continuous waveform (that could be wireless) within the response bandwidth of the shuttle 1204. This input induces a force at resonance, which in turn instigates resonance vibration of the shuttle 1204, ultimately with an amplitude that grows until the shuttle impacts the output electrode(s) 1216. Upon each impact, current flows from the battery supply $V_{DD}$ 1218 to the output load capacitor $C_L$, 1220 quickly charging it to $V_{DD}$.

At this point, if the shuttle continues to impact the output electrode 1216, $C_L$ 1220 remains charged to $V_{DD}$, which means there is no periodic clock signal. A clock signal, of course, requires that $C_L$ 1220 charge and discharge periodically. $R_{bleed}$ 1222 in FIG. 12 is poised to discharge $C_L$ 1220 at a designed "bleed" rate, but only if impacting stops. The present clock generator realizes cessation of impacting by designing the resoswitch to squegg at a specific clock frequency.

FIG. 14B illustrates the squegging phenomenon where impact-induced disruption 1404 reduces the device's resonating element (shuttle 1204) to lose oscillation amplitude (hence stop impacting), then recover oscillation amplitude to impact again 1406, only to again lose amplitude, in a periodic and repeatable fashion. The resulting time domain waveform of FIG. 14C, with periodic peaks and valleys, then provides a stable frequency that can then serve as a local on-board clock for low data rate applications.

The ability to generate a stable clock output derives not from reception of a specific modulated signal, but rather from the "squegging" resonance impact dynamics.

Figure 15A:
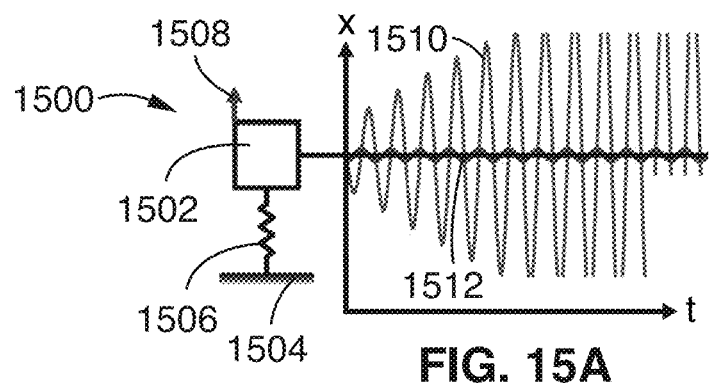
FIG. 15A is a simulated resoswitch with an input transient waveform showing zero phase shift $\Delta\varphi$ due to a complete lack of shuttle-electrode impact.
Figure 15B:
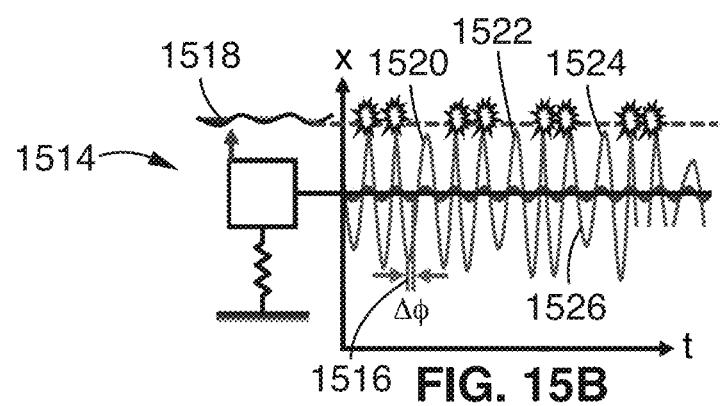
FIG. 15B is the same simulated resoswitch of FIG. 15A, where small phase shifts $\Delta\varphi$ are observed for soft shuttle-electrode impacts.
Figure 15C:
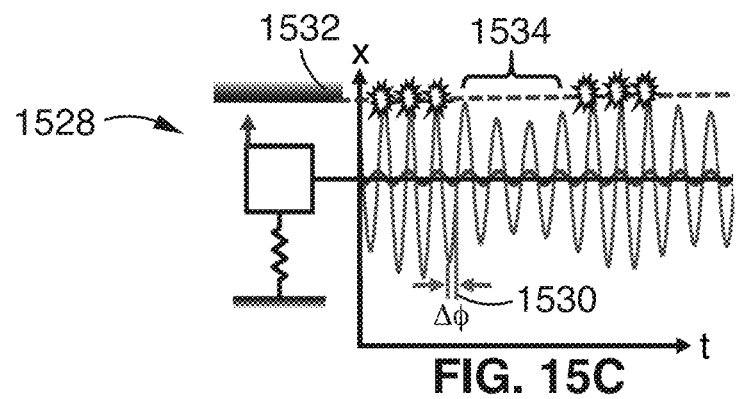
FIG. 15C is the same simulated resoswitch of FIG. 15A, where large phase shifts $\Delta\varphi$ are observed for hard impacts.

Refer now to FIG. 15A through FIG. 15C. Here, FIG. 15A is a graph 1500 simulated resoswitch shuttle 1502 connected to ground 1504 via a spring 1506, and driven with an input waveform forcing function $F_{drive}$ 1508 applied to the shuttle 1502. This system shows a shuttle displacement 1510 with a zero phase shift $\Delta\varphi$ from the input $F_{drive}$ 1512 due to a complete lack of shuttle-electrode impact.

FIG. 15B is a graph 1514 of the same simulated resoswitch of FIG. 15A, where small phase shifts $\Delta\varphi$ 1516 are observed for soft impacts between the shuttle 1502 and a soft output electrode surface 1518. Here, it is seen that there are occasional missed impacts 1520, 1522, and 1524 due to phase shift variations leading to small amplitude shuttle 1502 displacement 1526.

FIG. 15C is a graph 1528 of the same simulated resoswitch of FIG. 15A, where large phase shifts $\Delta\varphi$ 1530 are observed for hard impacts between the shuttle 1502 and a hard output electrode surface 1532. It is seen here that several successive impacts are missed 1534 due to low amplitude shuttle 1502 displacement 1536

Referring to FIG. 15A through FIG. 15C, it may be seen that, in general, phase shifts pull the resoswitch out of synchronization with the drive force $F_{drive}$ 1512, reducing its efficiency and thereby causing squegging where no impacts occur over the next few cycles until the shuttle structure re-synchronizes with the input force and recovers to impact once again. The period of squegging is a function of contact electrode hardness. Thus the resoswitch 1200 in FIG. 12 employs soft-impacting cantilever contact electrodes to better control the amount of squegging, thereby better controlling the squegging frequency.

7. Squegging by Design

The resonance force response simulations in FIG. 15B and FIG. 15C more fully explain the mechanism behind squegging by comparison with the non-impacting (therefore non-squegged) case in FIG. 15A. With no impacts, the amplitude of the resonant structure oscillation of FIG. 15A grows until limited by (gentle) losses, at which point it reaches steady-state vibration, where its displacement phase lags that of the input excitation force by 90°.

The non-squegged operation of FIG. 15A contrasts when a nearby output electrode limits the displacement amplitude of the resonant structure, energy absorption upon contact imposes a phase delay $\Delta\varphi$ 1516 on shuttle bounce-back, which then lowers the efficiency of the input drive, resulting in a smaller subsequent amplitude in the next cycle.

The amount of phase shift, 1516 and 1530, and thus number of missed impact cycles (for instance 1520, 1522, and 1524 of FIG. 15B versus 1536 of FIG. 15C), depends strongly on the hardness of the contact: For the case of a soft contact, as in FIG. 15B, $\Delta\varphi$ 15165 is small, so very few cycles miss 1520, 1522, 1524, and very little squegging ensues.

A hard contact, on the other hand, is depicted in FIG. 15C. Here the hard contact imposes much larger dephasing $\Delta\varphi$ 1530 that results in many missed impact cycles 1534, giving $R_{bleed}$ 1222 enough time to discharge $C_L$ 1220.

Again, the resoswitch of the present CW clock generator differs from that of the previous FSK one in its use of a harder W/TiN contact interface, which enhances squegging and a stiffness-controllable cantilever (or other softening) contact electrode that together allow one to tune the impact hardness and thereby control the frequency and quality (i.e., stability) of squegging. Ultimately, the system recovers to a state where the displacement is again 90° phase-shifted from the input force, raising the drive force efficiency to grow the displacement amplitude to again impact, after which the cycle repeats. The stability of the cycle determines the ultimate stability of the clock.

As described elsewhere, there are numerous variables by which squegging and its periodicity can be controlled, including, but not limited to: gap distance, drive symmetry, Q, contact hardness (as governed by contact interface materials), and drive strength. Inevitably, each of these variables governs the squegging period by influencing contact dynamics.

To address contact dynamics, consider that before making contact with the electrode, the resonator experiences only the drive force $F_{drive}$. Upon impact, the impacting electrode applies a counteracting contact force $F_c$ on the resonator to prevent it from penetrating into the electrode. The relevant equations are:

$$F_c = k_x(x_1 - x_0) \quad (9)$$

$$m_1\ddot{x}_1 + b\dot{x}_1 + kx_1 = F_{drive} (x_1 < x_0) \quad (10)$$

$$m_1\ddot{x}_1 + b\dot{x}_1 + kx_1 = F_{drive} - F_c (x_1 \geq x_0) \quad (11)$$

where $x_1$, $m_1$, k and b are the displacement, equivalent mass, stiffness, and damping factor of the resonator, respectively. $x_0$ is the initial spacing between the resonator and the output electrode, i.e., the displacement threshold to be overcome before the resonator shuttle makes initial contact.

The contact force is a product of the penetration depth and the contact stiffness $k_c$, the latter of which increases with penetration depth. For the specific design here, the hard surface of the W/TiN contact material dictates very shallow penetration, which means $k_c$ is approximately constant over the period of contact. However, since the value of $k_c$ depends on many other factors, such as the contact velocity $v_1$, the surface roughness, and the mechanical stiffness of the electrode, it often takes the form of a fitting factor to satisfy the penetration tolerance.

To study how impacts influence the squegging frequency, one can introduce a post impact shuttle velocity $v_1'$, defined as $v_1' = rv_1$ where r is a coefficient of restitution that captures impact conditions and that increases with increasing hardness. A positive r means the impact does not invert the direction of the resonator's velocity, which means the resonator suffers a smaller phase setback $\Delta\varphi$ than impacting with a negative r factor. After each impact at time $t_n$, the initial conditions of differential Eq. (10) and Eq. (11) change to:

$$x_1(t_n) = x_0 \quad (12)$$

$$v_1 t_n^- = rv_1(t_n^+) \quad (13)$$

where $t_n^-$ and $t_n^+$ are the times before and after the $n^{th}$ impact at $t_n$, respectively. The effect of these initial conditions fade out as $$e^{-\left(\frac{\omega}{2Q}t\right)},$$

which means the displacement phase lag recovers with a time constant $\tau \sim 2Q/\omega$. Thus, the higher the Q, the longer it takes to recover, the more missed impacts, the longer the discharging period, and the lower the output squegging frequency. Some of these relationships are demonstrated below.

Figure 16:
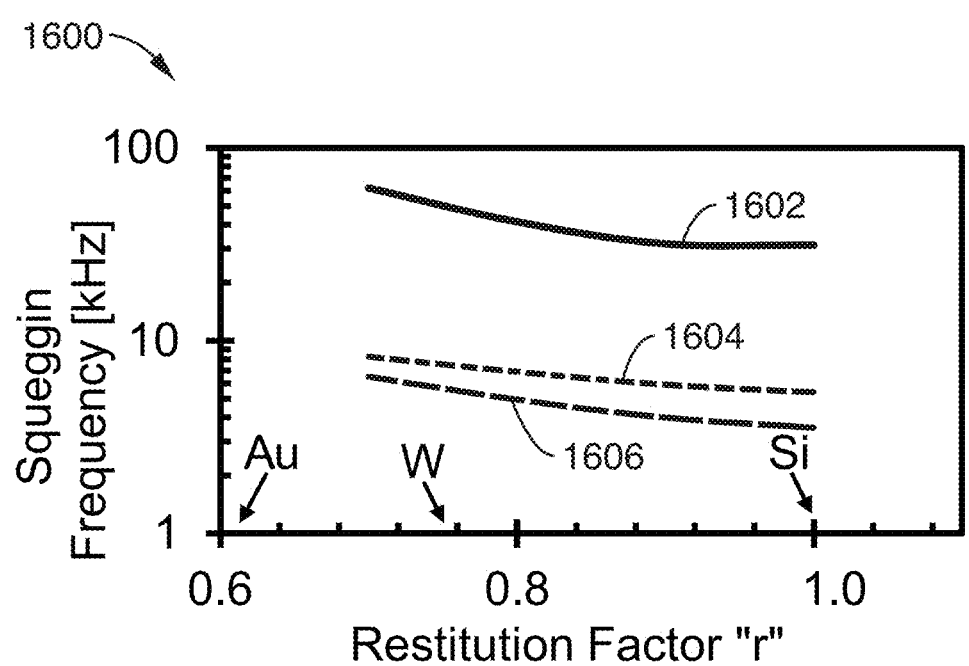
FIG. 16 is a graph of frequency versus restitution factor "r" for Q values of 50, 500, and 5000 that shows how electrode hardness and system Q influence squegging frequency.
Figure 17A:
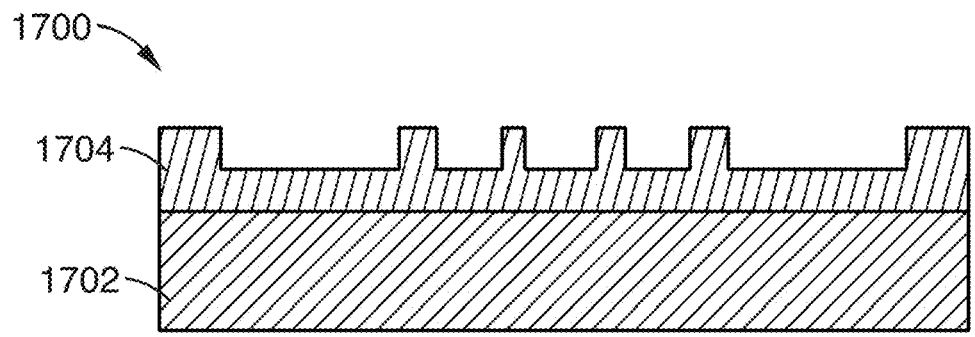
FIG. 17A is a cross sectional view of a substrate upon which 4 µm low pressure chemical vapor deposition (LPCVD) of sacrificial oxide has been deposited followed by lithographic patterning.
Figure 17B:
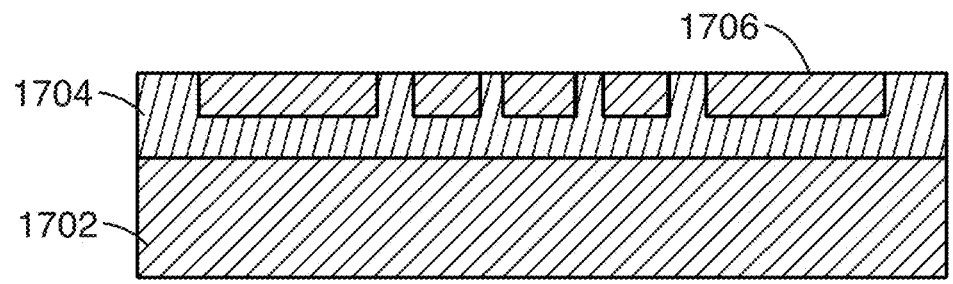
FIG. 17B is a cross sectional view of the section of FIG. 17A, where chemical mechanical planarization (CMP) has planarized the surface leaving the polysilicon flush with the oxide mold.
Figure 17C:
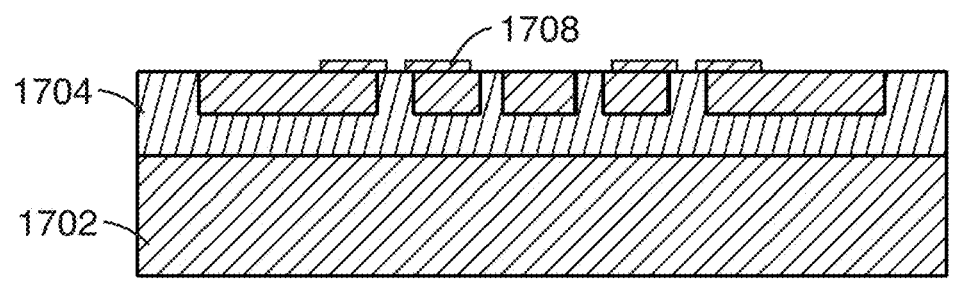
FIG. 17C is a cross sectional view of the section of FIG. 17B, where formation of metal impact contacts is shown sputtered and etched to the contact protrusion geometries.
Figure 17D:
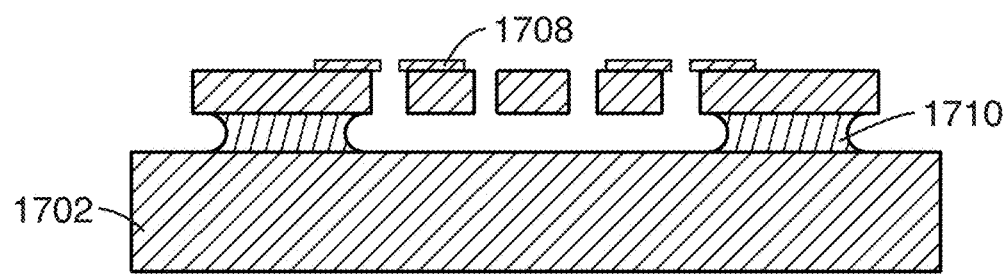
FIG. 17D is a cross sectional view of the section of FIG. 17C, where a timed wet etch of 49% HF has released the structure while leaving the anchor areas attached to the substrate.

Refer now to FIG. 16, which is a graph 1600 of frequency versus restitution factor "r" for Q values of 50, 500, and 5000 (respectively 1602, 1604, and 1606 on the graph) that shows how electrode hardness and system Q influence squegging frequency.

8. Material Design and Fabrication

Given its time-keeping function, the frequency of the CW clock generator should be low, which suggests its resonator element have high Q and its contact interface be hard. To insure high resonant Q, the resoswitch for CW clock generation uses polysilicon structural material to set elastic properties, while employing hard W/TiN metal (for long missed impact periods) only in areas where impacting contacts occur.

Refer now to FIG. 17A through FIG. 17D, which represent cross sections of the process flow of manufacturing a polysilicon resoswitch with W/TiN contact tips. The process starts 1700 in FIG. 17A with a substrate 1702 (typically silicon) upon which 4 µm LPCVD of sacrificial oxide 1704 has been deposited followed by lithographic patterning using a negative structure mask and a timed etch to remove 2 µm of the oxide, leaving behind a mold to shape a subsequent in situ phosphorous-doped polysilicon deposition 1706 to the desired structural geometry. Next, chemical mechanical planarization (CMP) planarizes the surface leaving the polysilicon flush with the oxide mold in FIG. 17B. This facilitates subsequent formation of metal impact contacts 1708 in FIG. 17C, for which 150 nm of W followed by 20 nm of TiN are sputtered and etched to the contact protrusion geometries, which cover only areas near the contact points. The majority of the resonator structure, especially its folded-beam supports, remains metal free, so retains a very high Q.

The metal etch recipe comprises two steps: first, an $SF_6$ plasma etch cuts through the TiN protective layer above W; then, a wet etch in $H_2O_2$ solution using the TiN as a mask is used to remove the remaining W. The wet etch leaves the polysilicon beneath intact, preserving its Q. Finally, a timed wet etch in 49% HF with galvanic corrosion-suppressing anti-oxidant releases the structure while leaving the anchor areas 1710 attached to the substrate in FIG. 17D. Note that it is actually the portions of W/TiN protruding beyond the polysilicon edges that actually make switch contact.

Figure 18A:
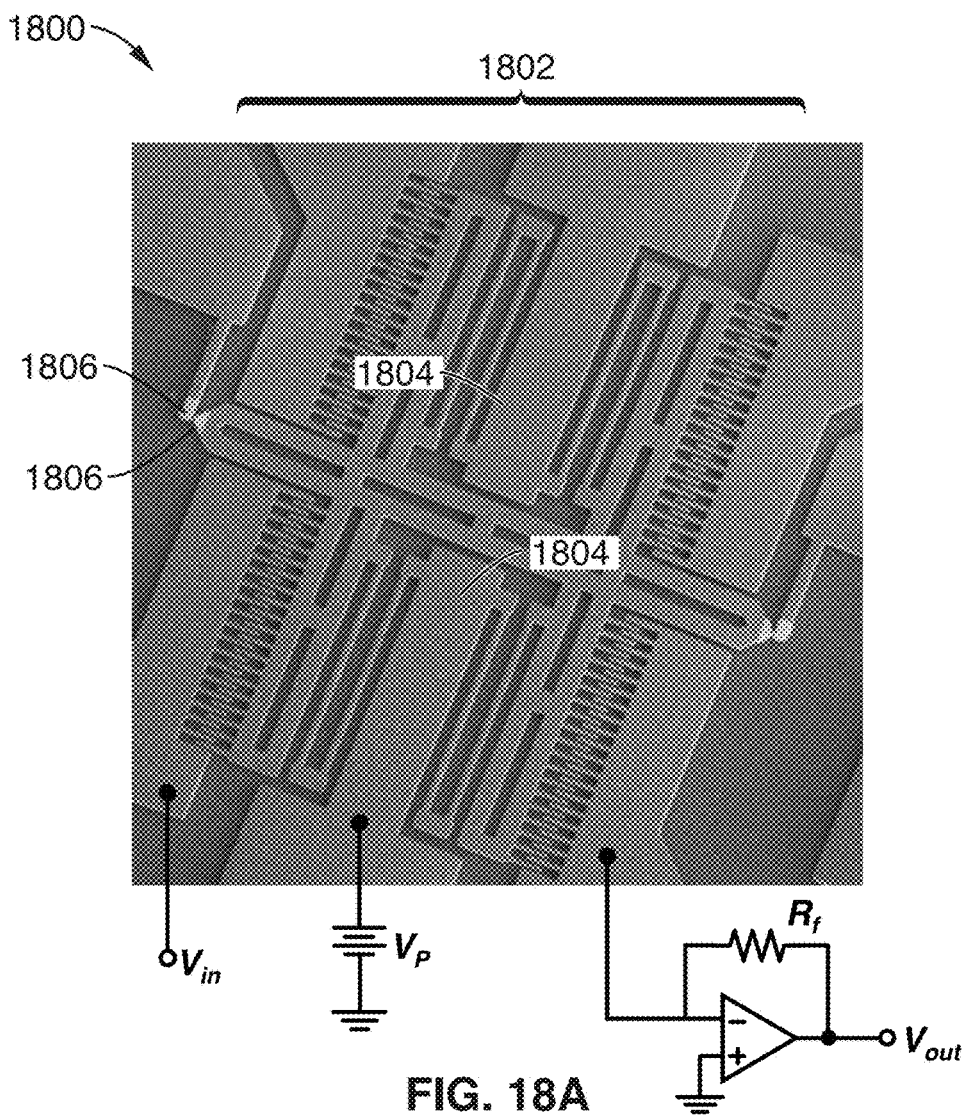
FIG. 18A is a scanning-electron micrograph (SEM) of the released MEMS resoswitch structure produced by using the process steps of FIG. 17A through FIG. 17D, with a few ancillary electrical connections displayed.

FIG. 18A is a scanning-electron micrograph (SEM) of the released resoswitch structure 1800 produced using the process steps of FIG. 17A through FIG. 17D, with ancillary electrical connections displayed. This fabricated resoswitch 1802 has on it anchor regions 1804 and W/TiN contact regions 1806.

9. Experimental Results

The fabricated resoswitch 1802 was wirebonded onto a printed circuit board (PCB) and emplaced into a custom-built bell jar to provide a 100 µTorr vacuum test environment and allow SubMiniature Version A (SMA) connections to external test instrumentation that include voltage sources and an oscilloscope.

Figure 18B:
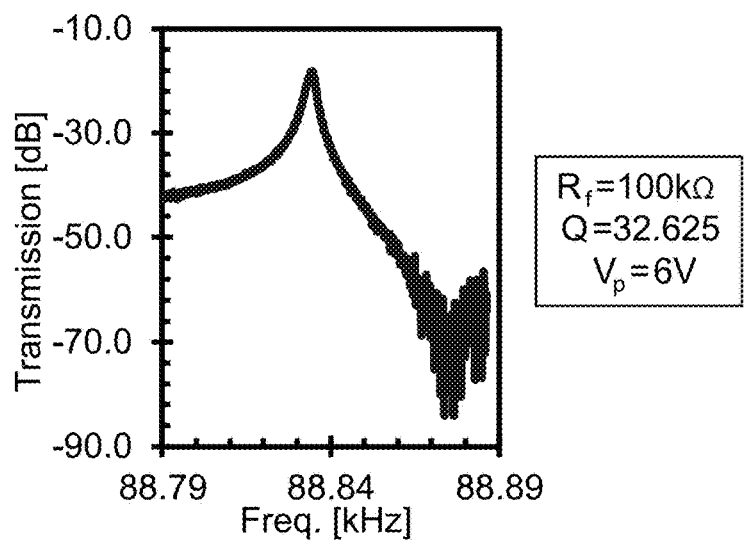
FIG. 18B is a graph of the transmission versus frequency of a non-impacting fabricated MEMS resoswitch, showing a vacuum tested Q of 32,625, which is 23 times higher than a previous resoswitch.

Refer now to FIG. 18B, which is a graph of the transmission versus frequency of a non-impacting fabricated resoswitch 1802, showing a vacuum Q of 32,625, which is 23 times higher than a previous resoswitch, enabled largely by the use of an anti-oxidant during HF release. In this test, $R_f$=100 kΩ and $V_p$=6V.

Figure 19A:
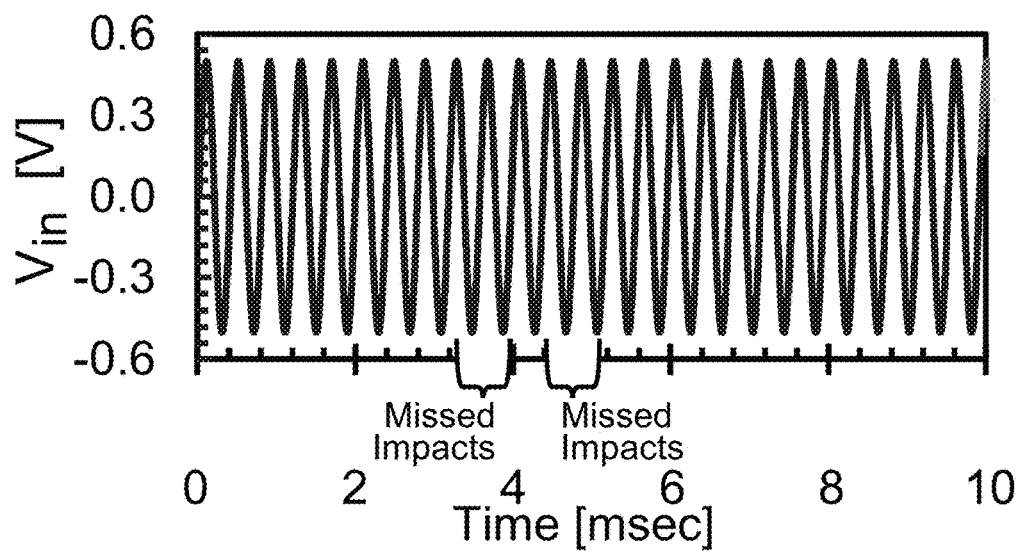
FIG. 19A is an amplitude versus time graph of a −50 dBm continuous wave (CW) input signal that is used to drive the MEMS resoswitch to impacting, but with squegged behavior, where impacts do not occur on all cycles.
Figure 19B:
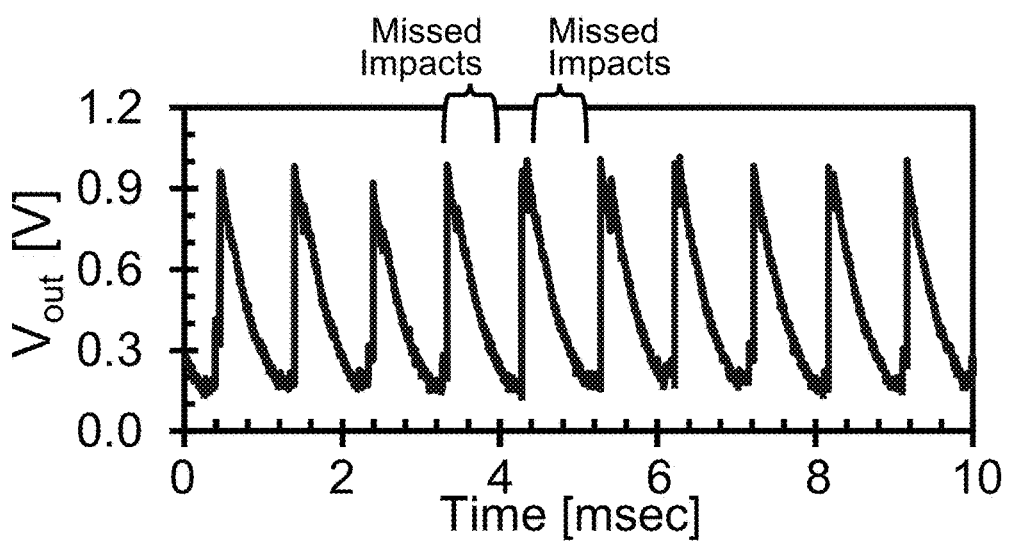
FIG. 19B is a graph of $V_{out}$ versus time for the resoswitch of FIG. 2B.
Figure 19C:
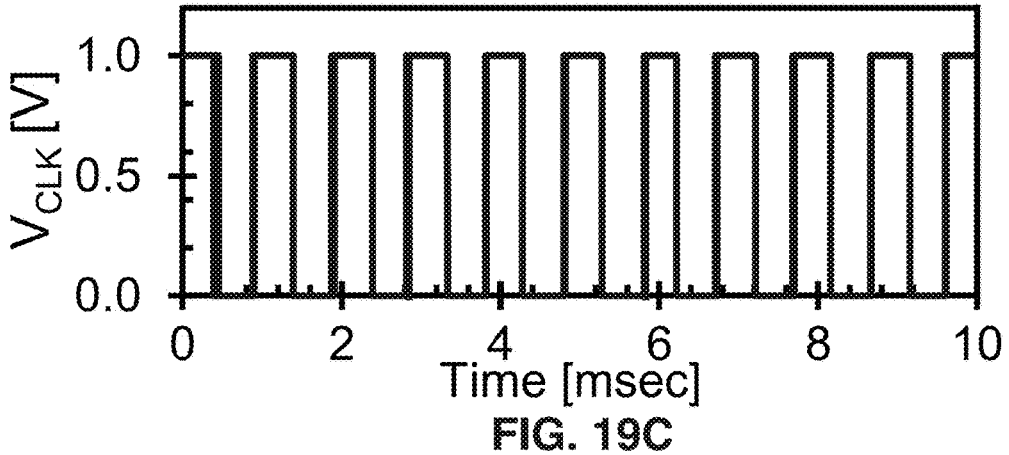
FIG. 19C is a graph of the $V_{clk}$ local clock output.

Refer now to FIG. 2B, along with FIG. 19A through FIG. 19C. FIG. 19A through FIG. 19C are all plots of measured waveforms at various points labeled in the FIG. 2B circuit. FIG. 19A is an amplitude versus time graph of a −50 dBm CW input signal that is used to drive the resoswitch 220 to impacting, but with squegged behavior, where impacts do not occur on all cycles, as indicated by the varying amplitudes in FIG. 19B and FIG. 19C.

FIG. 19B is a graph of $V_{out}$ 238 versus time. Following the same time scale, FIG. 19C is a graph of the $V_{clk}$ 242 local clock output.

Thus, impact-based charging of the output capacitor $C_L$ occurs only at the beginning of a squegging cycle, after which $C_L$ discharges through bleed resistor $R_{bleed}$, inevitably generating the triangle waveform of FIG. 19B shown with a frequency of 1 kHz determined by resoswitch design.

Figure 20:
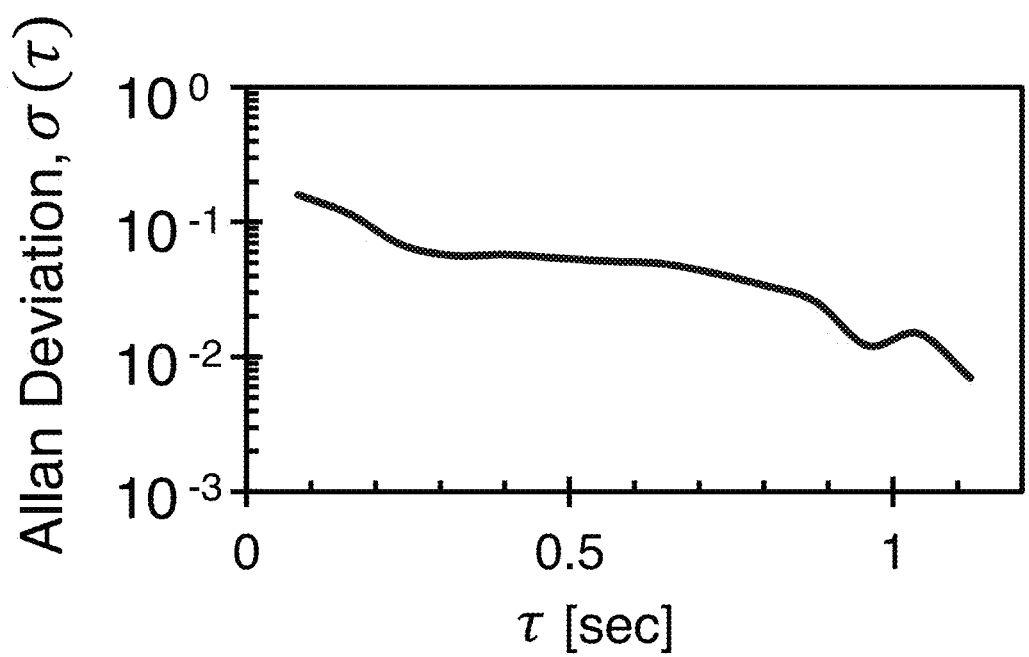
FIG. 20 is the measured Allan deviation versus period for the triangle waveform of FIG. 19B that reaches $10^{-3}$.

Refer now to FIG. 20, which is the measured Allan deviation for the triangle waveform of FIG. 19B that reaches $10^{-3}$. This is sufficiently stable for low-end commercial applications, such as timers for washing machines and low data rate wireless sensors. Addition of a single inverter provides a cleaner square-wave signal of FIG. 19C, but is actually not needed for rising edge-triggered systems.

Refer back to FIG. 12. Here, the output node 1232 of the resoswitch connects via wirebond to two separate following stages: 1) a buffer 1224 (Texas Instruments THS4271) that feeds the oscilloscope; and 2) an inverter 1228 that produces the square wave clock output. The total capacitive load presented to the resoswitch output node 1232 thus combines 0.8 pF of buffer 1224 input capacitance, 10 pF of inverter 1228 input capacitance, and 7.5 pF of internal chip capacitance, for a total of 18.3 pF. With $V_{DD}$ 1218 of 1V, clock frequency $f_{CLK}$ of 1 kHz, and a duty cycle D of 1/60 (which allows one to neglect current through a 30MΩ $R_{bleed}$ 1222), the total power consumption is 18.3 nW. Without the inverter 1228, when outputting a triangle wave into only the 0.8 pF input capacitance of the buffer, the clock only consumes 1.3 nW, which is 770 times lower than the 1 µW of a typical RTC.

10. CW-Powered Clock Generator Closing Remarks

With its ability to use energy from a simple CW wave and with no modulation required, the demonstrated mechanical CW clock generator potentially enables scenarios where even the simplest inexpensive products, e.g., toys, paper, can benefit from an embedded clock that might be key to smart operation as long as CW energy is available. Considering that radio signals are everywhere, even in remote areas (e.g., WWVB, AM), the prospects of this technology making available clocks that can permeate simple products is promising. Improved modeling and understanding of squegging has already uncovered promising solutions to stability and accuracy problems that make for interesting research ahead.

It will be appreciated that this disclosure has described, in one exemplary embodiment, a microelectromechanical resonant switch ("resoswitch") that converts received radio frequency (RF) energy (at −58 dBm) into a 1-kHz clock output with less than 34.2 nW of local battery power, which is 28 times less than the 1 µW typical real-time clock (RTC). The resoswitch accepts incoming amplitude- or frequency-shift keyed clock-modulated RF energy at a carrier frequency, filters it, provides power gain via resonant impact switching, and finally envelop detects impact impulses to demodulate and recover the carrier clock waveform. The resulting output derives from the clock signal that originally modulated the RF carrier, resulting in a local clock that shares its originator's accuracy. A bare push-pull 1-kHz RF-powered mechanical clock generator driving an on-chip inverter gate capacitance of 5 fF can potentially operate with only 5 pW of battery power, 200,000 times lower than the typical RTC. Using an off-chip inverter with 17.5 pF of effective capacitance, a 1-kHz push-pull resonator would consume 17.5 nW.

It will also be appreciated that that the present disclosure encompasses multiple embodiments that include, but are not limited to, the following:

1. A clock generator apparatus for generating a low power clock output, comprising: a clock circuit configured for receiving operating power from a radio-frequency (RF) input signal operating at a first frequency; and a micromechanical resonant switch (resoswitch) in said clock circuit; wherein conversion from the wave radio-frequency input to a clock output at a second frequency is performed in response to impacting of the micromechanical resonant switch (resoswitch), so that impact-induced energy loss compels the resonating element to lose oscillation amplitude, which thus stops impacting, then recovers to impact again, in a periodic and repeatable manner to output a time domain waveform with periodic peaks and valleys at said second frequency which is lower than said first frequency.

2. The apparatus of any preceding embodiment, wherein said micromechanical resonant switch (resoswitch) comprises a comb-driven micromechanical structure having impact points that impact one or more output electrodes in response to a resonance vibration large enough to cause impact.

3. The apparatus of any preceding embodiment, wherein said micromechanical resonant switch (resoswitch) has a capacitively loaded output for collecting charge and a bleed resistor or current source.

4. The apparatus of any preceding embodiment, wherein said first frequency is in radio-frequency range from the low kHz range up through the high MHz range.

5. The apparatus of any preceding embodiment, wherein said first frequency is modulated with a desired modulation type.

6. The apparatus of any preceding embodiment, wherein said second frequency is at least one order of magnitude, factor of ten, lower in frequency than said first frequency.

7. The apparatus of any preceding embodiment, wherein said clock circuit is configured with at least one input section having a resonant frequency equal to said first frequency from the continuous wave radio-frequency (RF) input signal.

8. The apparatus of any preceding embodiment, wherein said clock circuit is configured to block receipt of other radio-frequency components which are not at not at said resonant frequency.

9. The apparatus of any preceding embodiment, wherein said micromechanical resonant switch (resoswitch) is configured for accumulating phase shift at each impact of the signal from said continuous wave radio-frequency (RF) input, toward generating a squegged output from said clock generator apparatus.

10. The apparatus of any preceding embodiment, wherein said clock generator apparatus provides a stable frequency output at a fraction of the RF input frequency, whereby said clock can serve as a local on-board clock generator in many different systems.

11. The apparatus of any preceding embodiment, wherein said clock generator apparatus does not require a positive feed-back sustaining amplifier to sustain oscillation.

12. The apparatus of any preceding embodiment, further comprising an inverter for converting the triangle waveform of said clock generator apparatus to a square wave output.

13. The apparatus of any preceding embodiment, wherein said clock circuit receives its power via a radio frequency (RF) signal by utilizing a micromechanical resoswitch to receive a modulated clock signal and squegging to output a triangle wave output at a lower frequency than the rate of modulation of said received radio-frequency.

14. The apparatus of any preceding embodiment, wherein said apparatus is configured as an ultra low-power oscillator for a low power clocking application.

15. The apparatus of any preceding embodiment, wherein said apparatus is configured as a low-power oscillator in harsh environments in which the circuits are subject to either radioactivity or extreme heat, or combinations thereof.

16. The apparatus of any preceding embodiment, wherein said apparatus is configured as a clock generator to drive frequency hopping RF communication systems.

17. The apparatus of any preceding embodiment, wherein said apparatus is configured as a real-time clock (RTC) for use in an autonomous sensor network for synchronizing sleep and wake cycles.

18. The apparatus of any preceding embodiment, wherein said apparatus is configured for inclusion within a mobile device, wearable device, and/or various consumer products and devices.

19. The apparatus of any preceding embodiment, wherein the clock circuit is excited by a frequency shift keying (FSK) modulated wave.

20. The apparatus of any preceding embodiment, wherein the clock circuit is excited by a continuous wave.

21. A clock generator, comprising: a microelectromechanical system (MEMS) resonant switch (resoswitch) comprising an oscillating shuttle; wherein a radio frequency (RF) input signal drives the oscillation of the shuttle; wherein an oscillation of the shuttle causes an impact of the shuttle with one or more output electrodes; wherein, with each impact, a load capacitor charge state is changed by contact between the shuttle and output electrode; and wherein a clock output signal is generated based on the load capacitor charge state.

22. The apparatus of any preceding embodiment, wherein from the RF input signal is at a first frequency, and the clock output signal is at a lower second frequency.

23. The apparatus of any preceding embodiment, wherein each impact is followed by a missed impact comprising one or more oscillations of shuttle movement not making impact.

24. The apparatus of any preceding embodiment, wherein a duration of the missed impact time is periodic and repeatable.

25. The apparatus of any preceding embodiment, wherein the MEMS resoswitch comprises a comb structure for driving the shuttle in oscillation.

26. The apparatus of any preceding embodiment, wherein the load capacitor connects to a bleed resistor or current source.

27. The apparatus of any preceding embodiment, wherein the RF input signal is in a radio-frequency range from the low kHz range up through the high MHz range.

28. The apparatus of any preceding embodiment, wherein the RF input signal is modulated with a desired modulation type.

29. The apparatus of any preceding embodiment, wherein the clock output signal has an output clock frequency at least 10 times lower in frequency than the RF input signal frequency.

30. The apparatus of any preceding embodiment, wherein the MEMS resoswitch is configured with at least one input section having a resonant frequency equal to the radio-frequency (RF) input signal.

31. The apparatus of any preceding embodiment, wherein the MEMS resoswitch is configured to block receipt of other radio-frequency components that are not at the resonant frequency of the oscillating shuttle.

32. The apparatus of any preceding embodiment, wherein the MEMS resonant switch (resoswitch) is configured for accumulating phase shift at each shuttle-to-output electrode impact when driven by said radio-frequency (RF) input signal, wherein generating a squegged clock output from said clock generator apparatus.

33. The apparatus of any preceding embodiment, wherein the clock output signal occurs at a stable frequency output at a fraction of the radio-frequency (RF) input signal frequency, whereby said clock output signal can serve as a local on-board clock generator in many different systems.

34. The apparatus of any preceding embodiment, wherein the MEMS resonant switch (resoswitch) operates without a positive feed-back sustaining amplifier to sustain shuttle oscillation.

35. The apparatus of any preceding embodiment, wherein the clock output signal is generated by an inverter that inverts the load capacitor charge state to a square wave output.

36. The apparatus of any preceding embodiment, wherein said oscillating shuttle motion is powered solely via the radio frequency (RF) input signal.

37. The apparatus of any preceding embodiment, wherein the MEMS resonant switch (resoswitch) is configured as an ultra low-power oscillator for a low power clocking application.

38. The apparatus of any preceding embodiment, wherein the MEMS resonant switch (resoswitch) is configured as a low-power oscillator in harsh environments where the resoswitch is subject to one or more of the following conditions: radioactivity, temperature, or combinations thereof.

39. The apparatus of any preceding embodiment, wherein the MEMS resonant switch (resoswitch) is configured as a clock generator to drive frequency hopping radio frequency (RF) communication systems.

40. The apparatus of any preceding embodiment, wherein the MEMS resonant switch (resoswitch) is configured as a real-time clock (RTC) for use in an autonomous sensor network for synchronizing sleep and wake cycles.

41. The apparatus of any preceding embodiment, wherein the MEMS resonant switch (resoswitch) is configured for inclusion within a mobile device, wearable device, or various consumer products and devices.

42. The apparatus of any preceding embodiment, wherein the oscillating shuttle is driven by a frequency shift keying (FSK) modulated wave.

43. The apparatus of any preceding embodiment, wherein the oscillating shuttle is excited by a continuous wave (CW).

44. A method of clock generation, comprising: receiving a radio frequency (RF) input signal; providing a microelectromechanical system (MEMS) resonant switch (resoswitch) comprising an oscillating shuttle; driving the oscillating shuttle with the radio frequency (RF) input signal; impacting the shuttle with one or more output electrodes after an oscillation of the shuttle causes an impact; changing a load capacitor charge state at each impact contact between the shuttle and output electrode; and generating a clock output signal based on the load capacitor charge state.

45. The method of any preceding embodiment, wherein from the RF input signal is at a first frequency, and the clock output signal is at a lower second frequency.

46. The method of any preceding embodiment, comprising: following each impact with a missed impact comprising one or more oscillations of shuttle movement not making impact.

47. The method of any preceding embodiment, wherein a duration of the missed impact time is periodic and repeatable.

48. The method of any preceding embodiment, wherein the MEMS resoswitch comprises a comb structure for driving the shuttle in oscillation.

49. The method of any preceding embodiment, wherein the load capacitor connects to a bleed resistor or current source.

50. The method of any preceding embodiment, wherein the RF input signal is in a radio-frequency range from the low kHz range up through the high MHz range.

51. The method of any preceding embodiment, wherein the RF input signal is modulated with a desired modulation type.

52. The method of any preceding embodiment, wherein the clock output signal has an output clock frequency at least 10 times lower in frequency than the RF input signal frequency.

53. The method of any preceding embodiment, wherein the MEMS resoswitch is configured with at least one input section having a resonant frequency equal to the radio-frequency (RF) input signal.

54. The method of any preceding embodiment, wherein the MEMS resoswitch is configured to block receipt of other radio-frequency components that are not at the resonant frequency of the oscillating shuttle.

55. The method of any preceding embodiment, wherein the MEMS resonant switch (resoswitch) is configured for accumulating phase shift at each shuttle-to-output electrode impact when driven by said radio-frequency (RF) input signal, thereby generating a squegged clock output from the MEMS resonant switch (resoswitch).

56. The method of any preceding embodiment, wherein the clock output signal occurs at a stable frequency output at a fraction of the radio-frequency (RF) input signal frequency, whereby said clock output signal can serve as a local on-board clock generator in many different systems.

57. The method of any preceding embodiment, wherein the MEMS resonant switch (resoswitch) operates without a positive feed-back amplifier to sustain shuttle oscillation.

58. The method of any preceding embodiment, comprising:
generating the clock output signal by inverting the load capacitor charge state to a square wave output.

59. The method of any preceding embodiment, wherein said oscillating shuttle oscillation is powered solely via the radio frequency (RF) input signal.

60. The method of any preceding embodiment, wherein the MEMS resonant switch (resoswitch) is configured as an ultra low-power oscillator for a low power clocking application.

61. The method of any preceding embodiment, wherein the MEMS resonant switch (resoswitch) is configured as a low-power oscillator in harsh environments where the resoswitch is subject to one or more of the following conditions: radioactivity, temperature, or combinations thereof.

62. The method of any preceding embodiment, wherein the MEMS resonant switch (resoswitch) is configured as a clock generator to drive frequency hopping radio frequency (RF) communication systems.

63. The method of any preceding embodiment, wherein the MEMS resonant switch (resoswitch) is configured as a real-time clock (RTC) for use in an autonomous sensor network for synchronizing sleep and wake cycles.

64. The method of any preceding embodiment, wherein the MEMS resonant switch (resoswitch) is configured for inclusion within a mobile device, wearable device, or various consumer products and devices.

65. The method of any preceding embodiment, wherein the oscillating shuttle is driven by a frequency shift keying (FSK) modulated wave.

66. The method of any preceding embodiment, wherein the oscillating shuttle is excited by a continuous wave (CW).

67. The method of any preceding embodiment, wherein each impact has a coefficient of restitution selected from a group of coefficients consisting of: less than 1.0, less than 0.90, less than 0.80, less than 0.70, less than 0.60, greater than 0.60, greater than 0.70, greater than 0.80, greater than 0.90, and greater than 0.95.

68. The method of any preceding embodiment, wherein the oscillating shuttle is driven by a frequency shift keying (FSK) modulated wave or a continuous wave (CW).

69. The method of any preceding embodiment, wherein the output electrodes are elastically deformable, or are mounted to an elastically deformable mount.

70. A resonant receiver, comprising: a microelectromechanical system (MEMS) resonant switch (resoswitch) comprising an oscillating shuttle; wherein a radio frequency (RF) input signal drives the oscillation of the shuttle; wherein an oscillation of the shuttle causes an impact of the shuttle with one or more output electrodes; wherein, with each impact, a load capacitor charge state is changed by contact between the shuttle and output electrode; and wherein a demodulated output is generated based on the load capacitor charge state.

71. The resonant receiver of any preceding embodiment, wherein the input signal is continuous wave (CW).

72. The resonant receiver of any preceding embodiment, wherein the input signal is frequency shift keyed (FSK).

73. The microelectromechanical system (MEMS) resonant switch (resoswitch) of any preceding embodiment, wherein the resowitch is a component of a resonant receiver.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All cited references are incorporated herein by reference in their entirety.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A clock generator, comprising:
   a microelectromechanical system (MEMS) resonant switch (resoswitch) comprising an oscillating shuttle;
   wherein a radio frequency (RF) input signal drives the oscillation of the shuttle;
   wherein an oscillation of the shuttle causes an impact of the shuttle with one or more output electrodes;
   wherein, with each impact, a load capacitor charge state is changed by contact between the shuttle and output electrode; and
   wherein a clock output signal is generated based on the load capacitor charge state.

2. The clock generator of claim 1, wherein from the RF input signal is at a first frequency, and the clock output signal is at a lower second frequency.

3. The clock generator of claim 1, wherein each impact is followed by a missed impact comprising one or more oscillations of shuttle movement not making impact.

4. The clock generator of claim 3, wherein a duration of the missed impact time is periodic and repeatable.

5. The clock generator of claim 1, wherein the MEMS resoswitch comprises a comb structure for driving the shuttle in oscillation.

6. The clock generator of claim 1, wherein the load capacitor connects to a bleed resistor or current source.

7. The clock generator of claim 1, wherein the RF input signal is in a radio-frequency range from the low kHz range up through the high MHz range.

8. The clock generator of claim 1, wherein the RF input signal is modulated with a desired modulation type.

9. The clock generator of claim 1, wherein each impact has a coefficient of restitution selected from a group of coefficients consisting of: less than 1.0, less than 0.90, less than 0.80, less than 0.70, less than 0.60, greater than 0.60, greater than 0.70, greater than 0.80, greater than 0.90, and greater than 0.95.

10. The clock generator of claim 1, wherein the MEMS resoswitch is configured with at least one input section having a resonant frequency equal to the radio-frequency (RF) input signal.

11. The clock generator of claim 10, wherein the MEMS resoswitch is configured to block receipt of other radio-frequency components that are not at the resonant frequency of the oscillating shuttle.

12. The clock generator of claim 1, wherein the MEMS resonant switch (resoswitch) is configured for accumulating phase shift at each shuttle-to-output electrode impact when driven by said radio-frequency (RF) input signal, wherein generating a squegged clock output from said clock generator apparatus.

13. The clock generator of claim 1, wherein the clock output signal occurs at a stable frequency output at a fraction of the radio-frequency (RF) input signal frequency, whereby said clock output signal can serve as a local on-board clock generator in many different systems.

14. The clock generator of claim 1, wherein the MEMS resonant switch (resoswitch) operates without a positive feed-back sustaining amplifier to sustain shuttle oscillation.

15. The clock generator of claim 1, wherein the clock output signal is generated by an inverter that inverts the load capacitor charge state to a square wave output.

16. The clock generator of claim 1, wherein said oscillating shuttle motion is powered solely via the radio frequency (RF) input signal.

17. The clock generator of claim 1, wherein the MEMS resonant switch (resoswitch) is configured as an ultra low-power oscillator for a low power clocking application.

18. The clock generator of claim 1, wherein the MEMS resonant switch (resoswitch) is configured as a low-power oscillator in harsh environments where the resoswitch is subject to one or more of the following conditions: radio-activity, temperature, or combinations thereof.

19. The clock generator of claim 1, wherein the MEMS resonant switch (resoswitch) is configured as a clock generator to drive frequency hopping radio frequency (RF) communication systems.

20. The clock generator of claim 1, wherein the MEMS resonant switch (resoswitch) is configured as a real-time clock (RTC) for use in an autonomous sensor network for synchronizing sleep and wake cycles.

21. The clock generator of claim 1, wherein the MEMS resonant switch (resoswitch) is configured for inclusion within a mobile device, wearable device, or various consumer products and devices.

22. The clock generator of claim 1, wherein the oscillating shuttle is driven by a frequency shift keying (FSK) modulated wave or a continuous wave (CW).

23. The clock generator of claim 1, wherein the output electrodes are elastically deformable, or are mounted to an elastically deformable mount.

24. A method of clock generation, comprising:
receiving a radio frequency (RF) input signal;
providing a microelectromechanical system (MEMS) resonant switch (resoswitch) comprising an oscillating shuttle;
driving the oscillating shuttle with the radio frequency (RF) input signal;
impacting the shuttle with one or more output electrodes after an oscillation of the shuttle causes an impact;
changing a load capacitor charge state at each impact contact between the shuttle and output electrode; and
generating a clock output signal based on the load capacitor charge state.

25. The method of clock generation of claim 24, wherein from the RF input signal is at a first frequency, and the clock output signal is at a lower second frequency.

26. The method of clock generation of claim 24, comprising:
following each impact with a missed impact comprising one or more oscillations of shuttle movement not making impact.

27. The method of clock generation of claim 26, wherein a duration of the missed impact time is periodic and repeatable.

28. The method of clock generation of claim 24, wherein the MEMS resoswitch comprises a comb structure for driving the shuttle in oscillation.

29. The method of clock generation of claim 24, wherein the load capacitor connects to a bleed resistor or current source.

30. The method of clock generation of claim 24, wherein the RF input signal is in a radio-frequency range from the low kHz range up through the high MHz range.

31. The method of clock generation of claim 24, wherein the RF input signal is modulated with a desired modulation type.

32. The method of clock generation of claim 24, wherein the clock output signal has an output clock frequency at least 10 times lower in frequency than the RF input signal frequency.

33. The method of clock generation of claim 24, wherein the MEMS resoswitch is configured with at least one input section having a resonant frequency equal to the radio-frequency (RF) input signal.

34. The method of clock generation of claim 24, wherein the MEMS resoswitch is configured to block receipt of other radio-frequency components that are not at the resonant frequency of the oscillating shuttle.

35. The method of clock generation of claim 24, wherein the MEMS resonant switch (resoswitch) is configured for accumulating phase shift at each shuttle-to-output electrode impact when driven by said radio-frequency (RF) input signal, thereby generating a squegged clock output from the MEMS resonant switch (resoswitch).

36. The method of clock generation of claim 24, wherein the clock output signal occurs at a stable frequency output at a fraction of the radio-frequency (RF) input signal frequency, whereby said clock output signal can serve as a local on-board clock generator in many different systems.

37. The method of clock generation of claim 24, wherein the MEMS resonant switch (resoswitch) operates without a positive feed-back amplifier to sustain shuttle oscillation.

38. The method of clock generation of claim 24, comprising:
generating the clock output signal by inverting the load capacitor charge state to a square wave output.

39. The method of clock generation of claim 24, wherein said oscillating shuttle oscillation is powered solely via the radio frequency (RF) input signal.

40. The method of clock generation of claim 24, wherein the MEMS resonant switch (resoswitch) is configured as an ultra low-power oscillator for a low power clocking application.

41. The method of clock generation of claim 24, wherein the MEMS resonant switch (resoswitch) is configured as a low-power oscillator in harsh environments where the resoswitch is subject to one or more of the following conditions: radioactivity, temperature, or combinations thereof.

42. The method of clock generation of claim 24, wherein the MEMS resonant switch (resoswitch) is configured as a clock generator to drive frequency hopping radio frequency (RF) communication systems.

43. The method of clock generation of claim 24, wherein the MEMS resonant switch (resoswitch) is configured as a real-time clock (RTC) for use in an autonomous sensor network for synchronizing sleep and wake cycles.

44. The method of clock generation of claim 24, wherein the MEMS resonant switch (resoswitch) is configured for inclusion within a mobile device, wearable device, or various consumer products and devices.

45. The method of clock generation of claim 24, wherein the oscillating shuttle is driven by a frequency shift keying (FSK) modulated wave.

46. The method of clock generation of claim 24, wherein the oscillating shuttle is excited by a continuous wave (CW).

47. A resonant receiver, comprising:
a microelectromechanical system (MEMS) resonant switch (resoswitch) comprising an oscillating shuttle;
wherein a radio frequency (RF) input signal drives the oscillation of the shuttle;
wherein an oscillation of the shuttle causes an impact of the shuttle with one or more output electrodes;

wherein, with each impact, a load capacitor charge state is changed by contact between the shuttle and output electrode; and wherein a demodulated output is generated based on the load capacitor charge state.

48. The resonant receiver of claim 47, wherein the input signal is continuous wave (CW).

49. The resonant receiver of claim 47, wherein the input signal is frequency shift keyed (FSK).

* * * * *